US007794899B2

(12) United States Patent  
Hashimoto et al.

(10) Patent No.: US 7,794,899 B2  
(45) Date of Patent: Sep. 14, 2010

(54) PHOTO MASK, EXPOSURE METHOD USING THE SAME, AND METHOD OF GENERATING DATA

(75) Inventors: Koji Hashimoto, Yokohama (JP); Tadahito Fujisawa, Tokyo (JP); Yuko Kono, Kamakura (JP); Takashi Obara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 322 days.

(21) Appl. No.: 12/118,578

(22) Filed: May 9, 2008

(65) Prior Publication Data

US 2008/0222597 A1 Sep. 11, 2008

Related U.S. Application Data

(62) Division of application No. 10/832,995, filed on Apr. 28, 2004, now Pat. No. 7,384,712.

(30) Foreign Application Priority Data

Apr. 30, 2003 (JP) ............................... 2003-125576  
Apr. 9, 2004 (JP) ............................... 2004-115702

(51) Int. Cl.  
*G03F 1/00* (2006.01)

(52) U.S. Cl. ......................................................... 430/5

(58) Field of Classification Search .................. 430/5, 430/394; 716/19, 20, 21  
See application file for complete search history.

(56) References Cited

U.S. PATENT DOCUMENTS

| 5,242,770 A | 9/1993 | Chen et al. |
| 5,357,311 A | 10/1994 | Shiraishi |
| 5,447,810 A | 9/1995 | Chen et al. |
| 6,077,633 A | 6/2000 | Lin et al. |
| 6,413,683 B1 | 7/2002 | Liebmann et al. |

(Continued)

FOREIGN PATENT DOCUMENTS

JP 03-210560 9/1991

(Continued)

OTHER PUBLICATIONS

Official Action from the German Patent and Trademark Office dated Mar. 14, 2007, in counterpart German Patent Application No. 10 2004 026 206.3-51.

(Continued)

*Primary Examiner*—Stephen Rosasco  
(74) *Attorney, Agent, or Firm*—Finnegan, Henderson, Farabow, Garrett & Dunner, L.L.P.

(57) ABSTRACT

A photo mask formed with patterns to be transferred to a substrate using an exposure apparatus, the photo mask comprising a pattern row having three or more hole patterns surrounded by a shielding portion or a semitransparent film and arranged along one direction, and an assist pattern surrounded by the shielding portion or semitransparent film and having a longitudinal direction and a latitudinal direction, the assist pattern being located at a specified distance from the pattern row in a direction orthogonal to the one direction, the longitudinal direction of the assist pattern being substantially parallel with the one direction, the longitudinal length of the assist pattern being equivalent to or larger than the longitudinal length of the pattern row, the assist pattern being not transferred to the substrate.

4 Claims, 24 Drawing Sheets

U.S. PATENT DOCUMENTS 7,001,693 B2 2/2006 Liebmann et al.
7,074,525 B2 7/2006 Wu et al.

FOREIGN PATENT DOCUMENTS

| JP | 05-217840 | 8/1993 |
| --- | --- | --- |
| JP | 06-95360 | 4/1994 |
| JP | 07-140639 | 6/1995 |
| JP | 08-76355 | 3/1996 |
| JP | 08-101491 | 4/1996 |
| JP | 8-160598 | 6/1996 |
| JP | 10-239827 | 9/1998 |
| JP | 11-202475 | 7/1999 |
| JP | 2000-98584 | 4/2000 |
| JP | 2002-353098 | 12/2002 |

OTHER PUBLICATIONS

Notification of Reasons for Rejection from the Japanese patent Office, mailed Nov. 12, 2007, in Japanese Patent Application No. 2004-115702 and English translation thereof.

Final Notice of Rejection issued by the Japanese Patent Office, mailed Mar. 18, 2008, in Japanese Patent Application No. 2004-115702 and English translation of Final Notice.

Notification of Reasons for Rejection, mailed Jun. 24, 2008, in corresponding Japanese Patent Application No. 2008-006240, and English Language translation thereof.

Official Letter of Inquiry mailed Sep. 8, 2009, in corresponding Japanese Patent Application No. 2004-115702, and English-language translation therof.

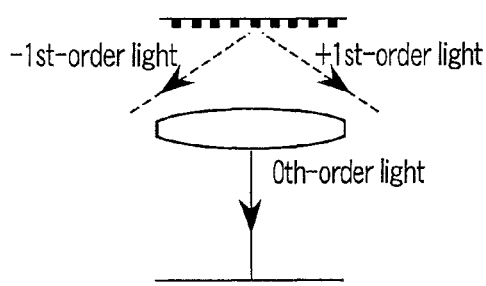
F I G. 6A
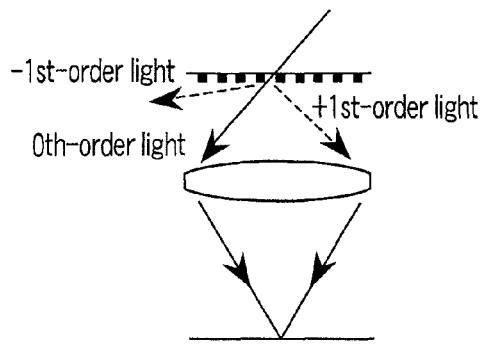
F I G. 6B
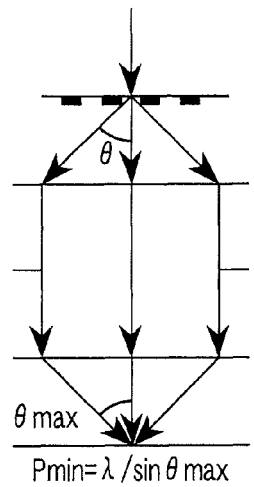
$Pmin = \lambda / \sin \theta max$
$= /NA$
F I G. 7A
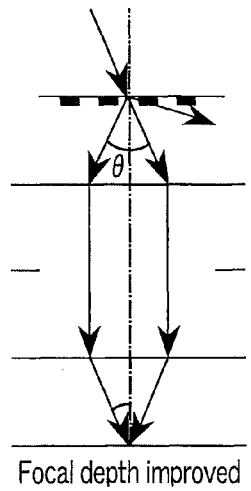
Focal depth improved
F I G. 7B
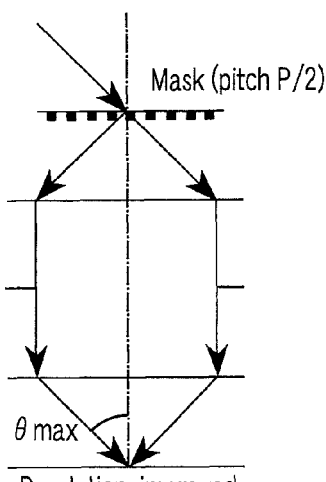
F I G. 8   Resolution improved

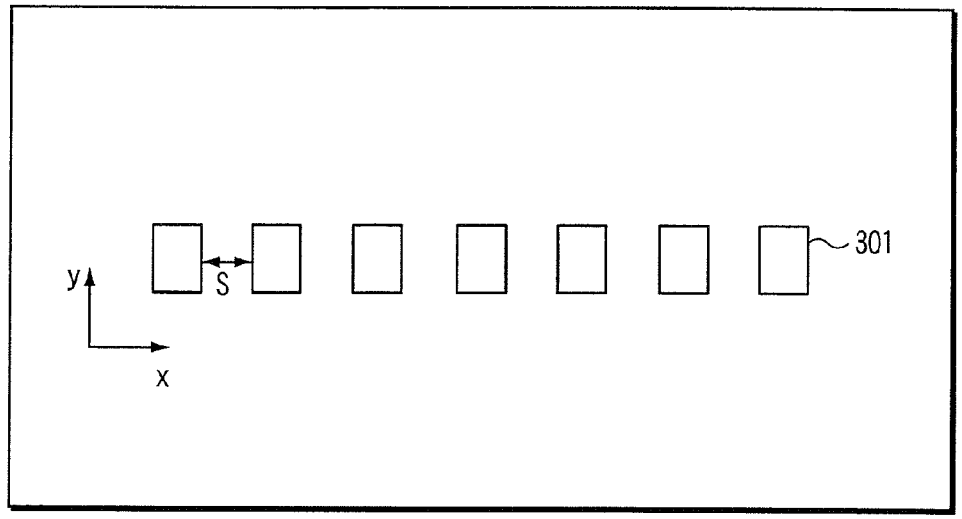
F I G. 14A
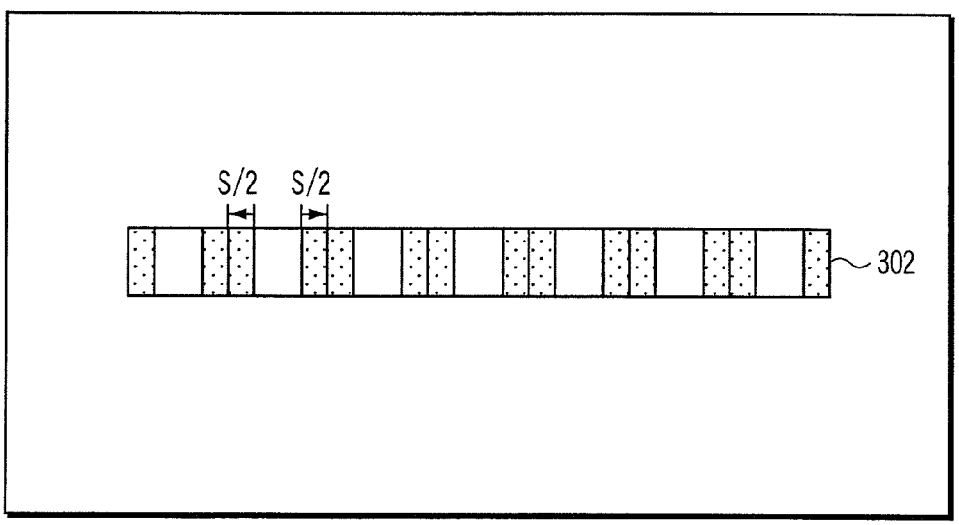
F I G. 14B

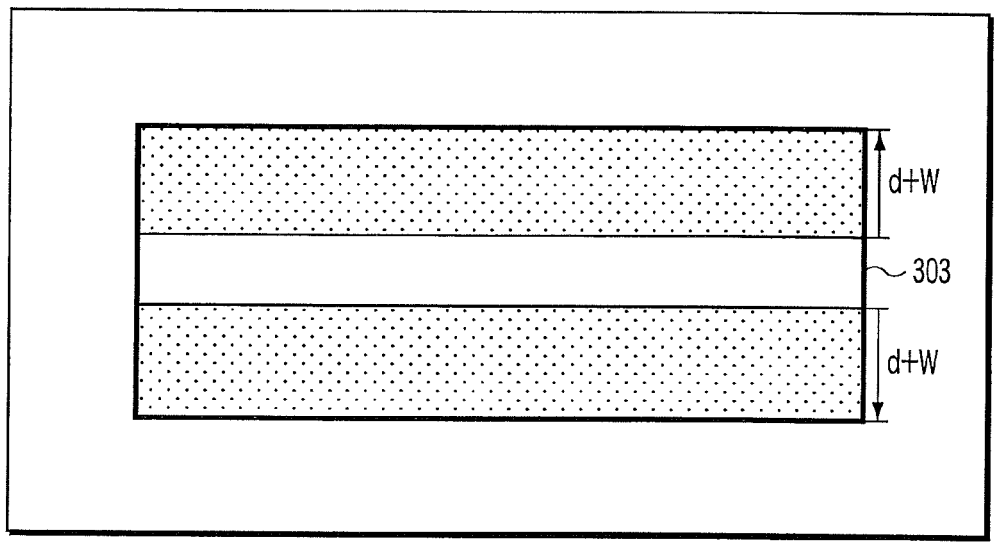
F I G. 14C
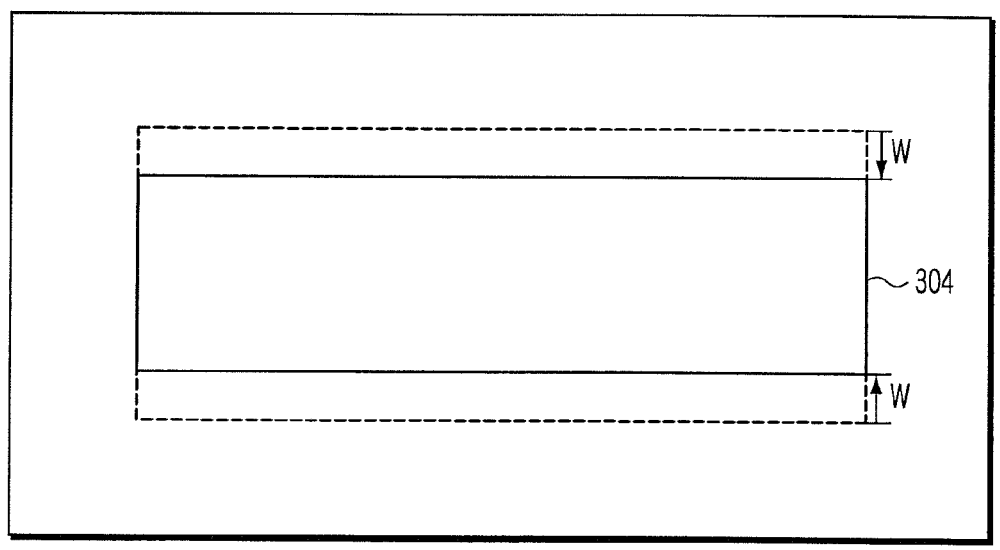
F I G. 14D

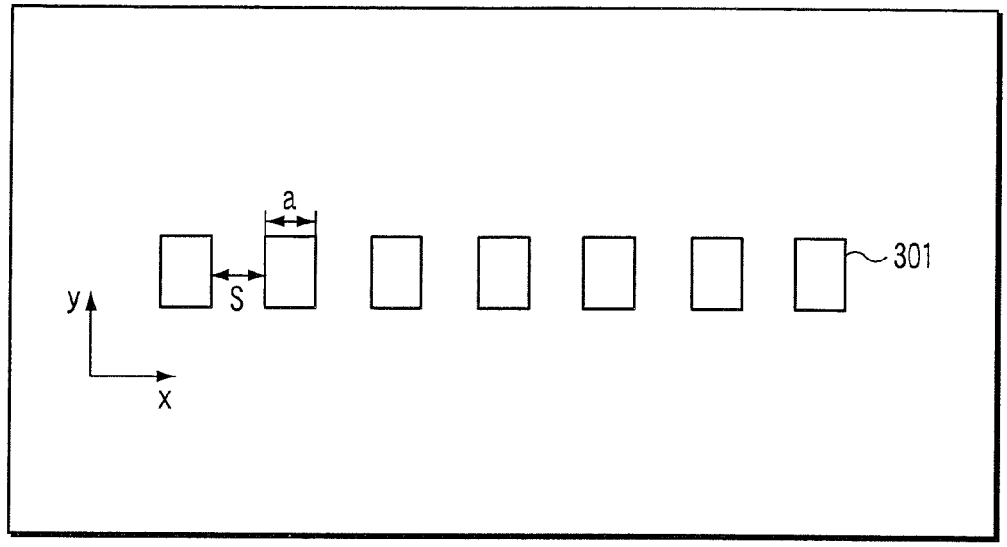
F I G. 15A
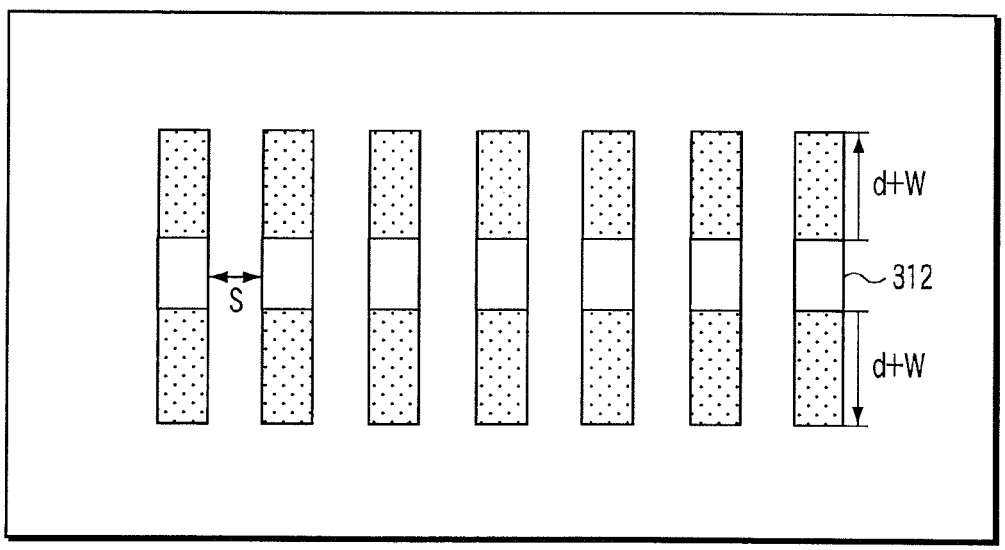
F I G. 15B

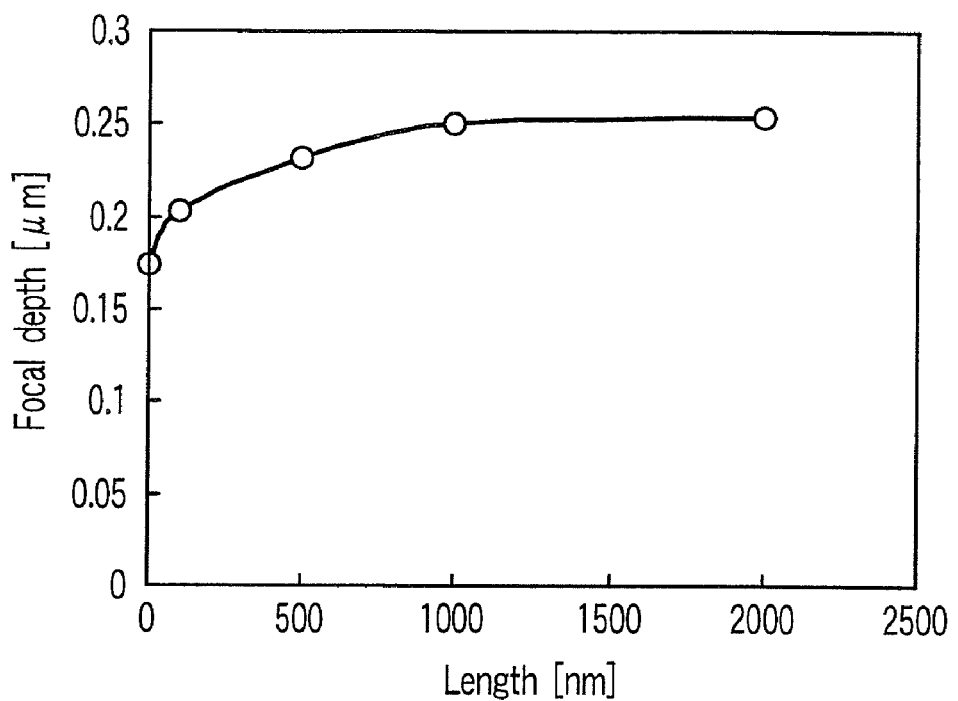
F I G. 20
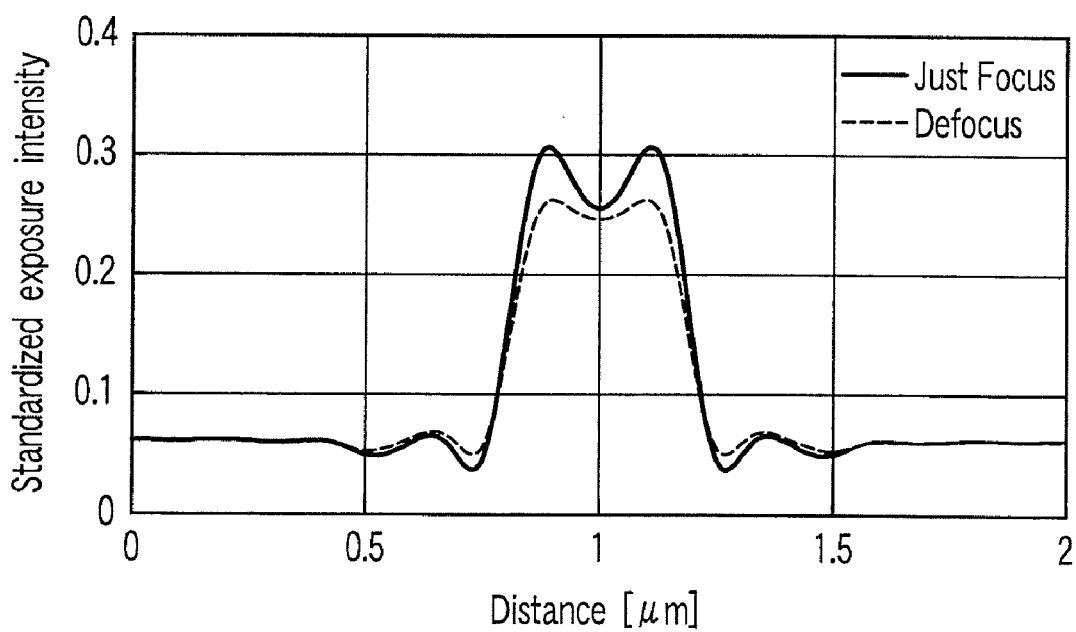
F I G. 21

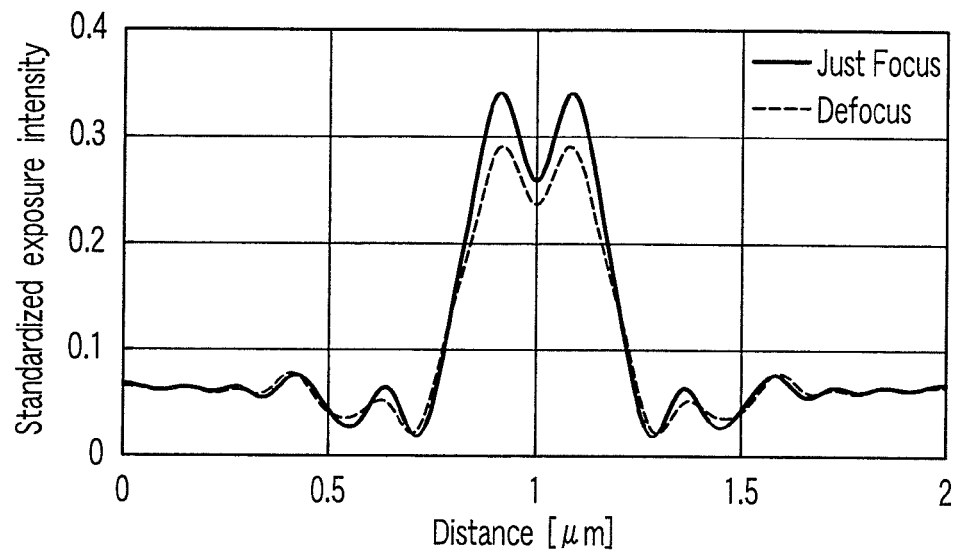
F I G. 22
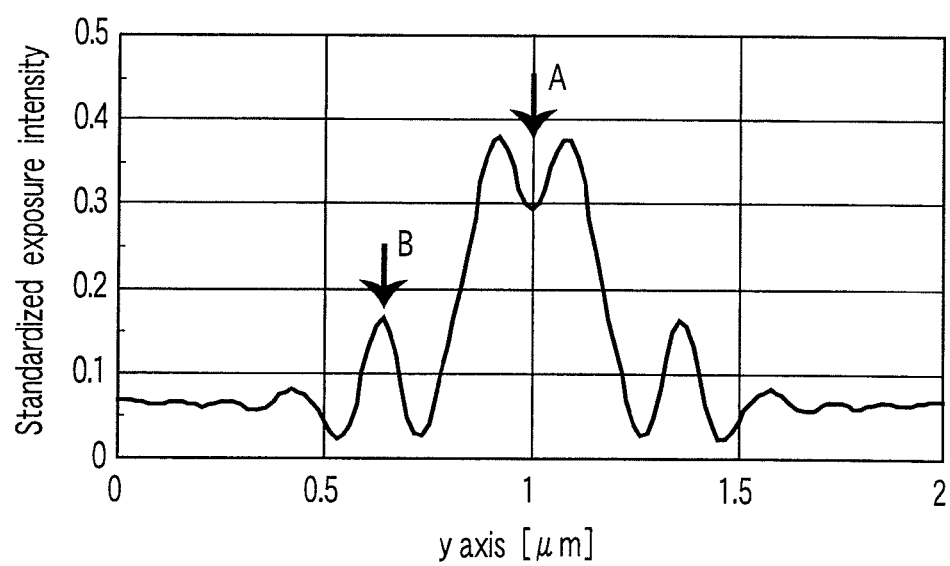
F I G. 23

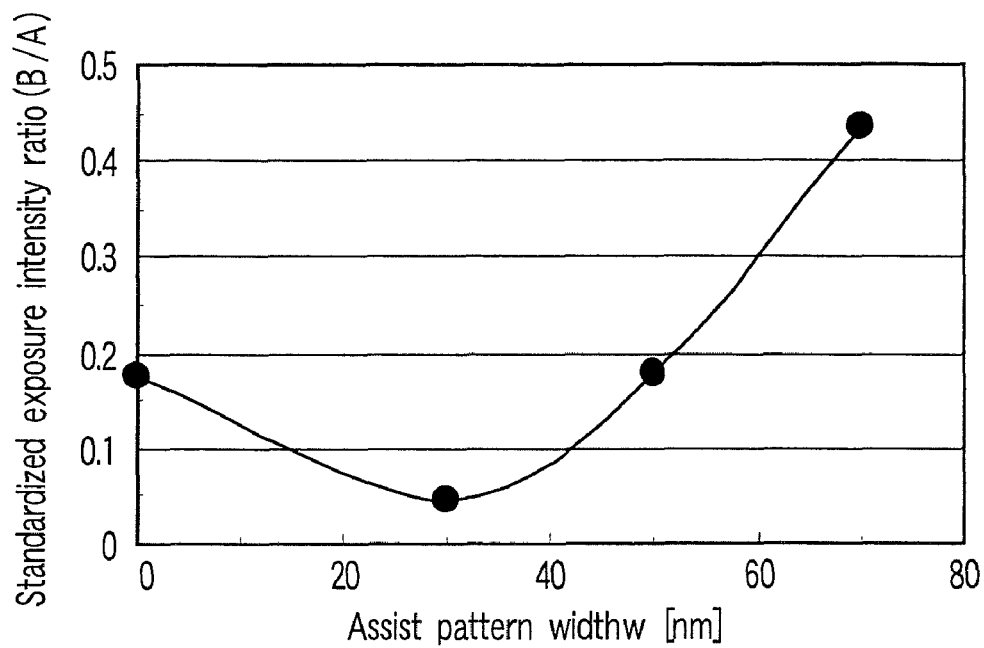
F I G. 24
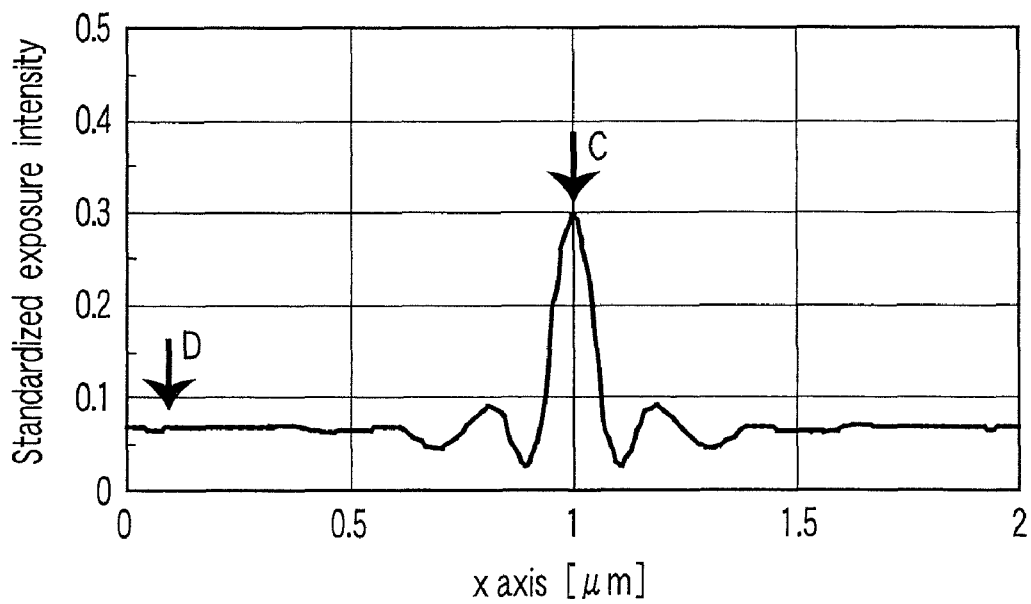
F I G. 25

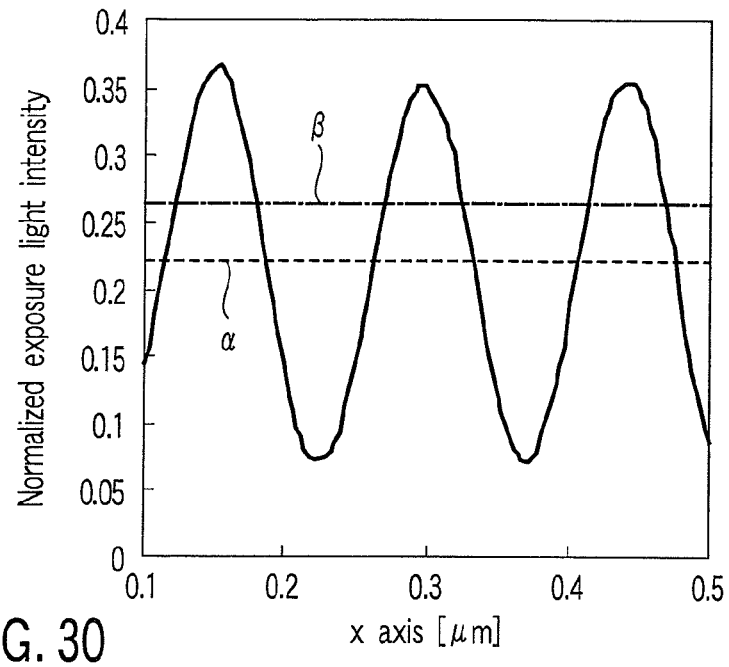
F I G. 30
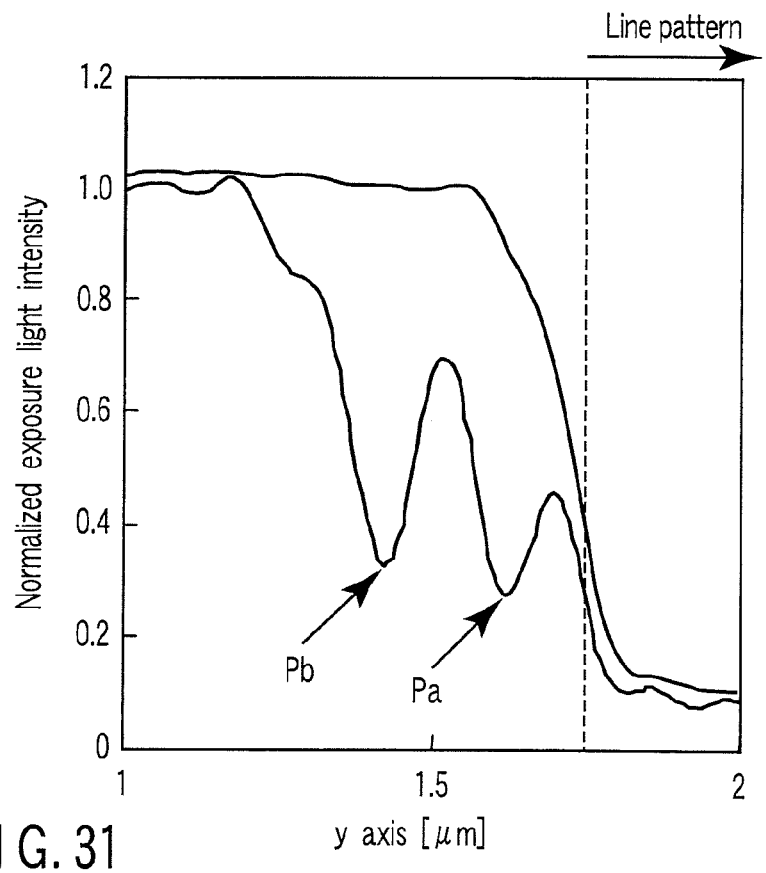
F I G. 31

PHOTO MASK, EXPOSURE METHOD USING THE SAME, AND METHOD OF GENERATING DATA

CROSS-REFERENCE TO RELATED APPLICATIONS

This application is a division of U.S. application Ser. No. 10/832,995, filed Apr. 28, 2004 now U.S. Pat. No. 7,348,712, which is based upon and claims the benefit of priority from prior Japanese Patent Applications No. 2003-125576, filed Apr. 30, 2003; and No. 2004-115702, filed Apr. 9, 2004. The entire contents of these applications are incorporated herein by reference in their entirety.

BACKGROUND OF THE INVENTION

1. Field of the Invention

The present invention relates to a photo mask having an assist pattern formed adjacent to a pattern, a method of manufacturing a semiconductor device using the photo mask, and a method of generating data for the photo mask.

2. Description of the Related Art

In the prior art, in forming fine hole patterns using a photo mask, resolution is improved by locating assist patterns with the same shape as that of main patterns, around the main patterns (FIG. 1 in Jpn. Pat. Appln. KOKAI Publication No. 10-239827). However, it will be assumed that a photo mask is projected and exposed which has, as a part of the whole pattern, a pattern row of fine contiguous hole patterns 401 such as those shown in FIG. 33. FIG. 34 shows the addition of assist patterns 402 to the pattern row shown in FIG. 33. However, the mask pattern shown in FIG. 34 has an insufficient resolution for the hole patterns 401 and thus only a small lithography margin.

There is a technique to form an assist pattern adjacent to a pattern having periodicity with respect to its adjacent patterns (Jpn. Pat. Appln. KOKAI Publication No. 7-140639). It will be assumed that the assist pattern is formed adjacent to a pattern not having periodicity with respect to the adjacent patterns. That is, the assist pattern is located adjacent to a rectangular pattern in its latitudinal direction. Also in this case, the rectangular pattern has an insufficient resolution and thus only a small lithography margin.

BRIEF SUMMARY OF THE INVENTION

According to an aspect of the present invention, there is provided a photo mask formed with patterns to be transferred to a substrate using an exposure apparatus, the photo mask being characterized by comprising a pattern row having three or more hole patterns surrounded by a shielding portion or a semitransparent film and arranged along one direction, and an assist pattern surrounded and formed by the shielding portion or semitransparent film and having a longitudinal direction and a latitudinal direction, the assist pattern being located at a specified distance from the pattern row in a direction orthogonal to the one direction, the longitudinal direction of the assist pattern being substantially parallel with the one direction, the longitudinal length of the assist pattern being equivalent to or larger than the longitudinal length of the pattern row, the assist pattern being not transferred to the substrate.

According to an aspect of the present invention, there is provided a method of manufacturing a semiconductor device, the method being characterized by comprising providing an exposure apparatus which transfers patterns formed on a photo mask to a resist film on a semiconductor substrate, providing the photo mask having patterns to be transferred to the substrate, the photo mask comprising a pattern row having three or more hole patterns surrounded by a shielding portion or a semitransparent film and arranged along one direction, and an assist pattern surrounded and formed by the shielding portion or semitransparent film and having a longitudinal direction and a latitudinal direction, the assist pattern being located at a specified distance from the pattern row in a direction orthogonal to the one direction, the longitudinal direction of the assist pattern being substantially parallel with the one direction, the longitudinal length of the assist pattern being equivalent to or larger than the longitudinal length of the pattern row, the assist pattern being not transferred to the substrate, and transferring the patterns formed on the photo mask to the resist film using the exposure apparatus.

According to an aspect of the present invention, there is provided a method of generating design data for a photo mask formed with patterns to be transferred to a substrate using an exposure apparatus, the method being characterized by comprising providing pattern data having a pattern row in which three or more hole patterns are arranged in one direction, executing a resizing process and a differentiating process on to generate an assist pattern, the longitudinal length of the assist pattern being equivalent to or larger than the length of the pattern row in one direction, the longitudinal direction of the assist pattern being substantially parallel with the one direction, the assist pattern being not transferred to the substrate; and merging the pattern data with the assist pattern to create the design data.

According to an aspect of the present invention, there is provided a photo mask formed with patterns to be transferred to a substrate using an exposure apparatus, the photo mask being characterized by comprising a main pattern surrounded by a shielding portion or a semitransparent film and having a longitudinal direction and a latitudinal direction, the main pattern being located so as not to have periodicity with respect to any patterns which are adjacent to the main pattern and which are transferred to the substrate, and an assist pattern surrounded by the shielding portion or semitransparent film, the assist pattern being located close to one end of the main pattern in the longitudinal direction, the width of the assist pattern in a direction parallel with the latitudinal direction of the main pattern being larger than the latitudinal width of the main pattern, the assist pattern being not transferred to the substrate.

According to an aspect of the present invention, there is provided a photo mask formed with patterns to be transferred to a substrate using an exposure apparatus, the photo mask comprising: a pattern row in which a plurality of line patterns each composed of a light shielding portion or a translucent film and having a longitudinal direction a latitudinal direction orthogonal to the longitudinal direction are periodically arranged in the latitudinal direction; and an assist pattern composed of the light shielding portion or translucent film and placed near a line end of the main patterns, the assist pattern having a length in the latitudinal direction of the line patterns which is larger than the length of the pattern row, the assist pattern not being transferred to the substrate.

BRIEF DESCRIPTION OF THE SEVERAL VIEWS OF THE DRAWING

FIGS. 6A and 6B are a diagram showing how diffracted light is generated from dense patterns and formed into an image;

FIGS. 7A and 7B are a diagram illustrating the principle of improvement of the focal depth using grazing incidence illumination;

FIG. 8 is a diagram illustrating the principle of improvement of the focal depth using grazing incidence illumination;

FIGS. 14A to 14F are a diagram illustrating a method of generating mask data according to a fourth embodiment;

FIGS. 15A to 15F are a diagram illustrating a method of generating mask data according to a fifth embodiment;

FIG. 20 is a graph showing the relationship between the focal depth at a focal tolerance of 8% and the length L of the assist pattern;

FIG. 21 is a graph showing a standardized light intensity on a substrate obtained if the phase shift mask shown in FIG. 16 is used;

FIG. 22 is a graph showing the standardized light intensity on the substrate obtained if the phase shift mask shown in FIG. 17 is used;

FIG. 23 is a graph showing the distribution of the light intensity of exposure light on a substrate in the direction of a y axis, the exposure light being transmitted through the phase shift mask shown in FIG. 16;

FIG. 24 is a graph showing the relationship between the ratio of a peak B to a peak A (B/A) and the assist pattern width W;

FIG. 25 is a graph showing the distribution of the light intensity of exposure light on the substrate in the direction of an x axis, the exposure light being transmitted through the phase shift mask;

FIG. 30 is a graph showing a normalized exposure light intensity distribution on a resist film obtained if the L/S pattern is transferred to the resist film;

FIG. 31 is a graph showing a normalized exposure light intensity distribution obtained if a pattern corresponding to design data is transferred to the resist film at an exposure light intensity β;

DETAILED DESCRIPTION OF THE INVENTION

Embodiments of the present invention will be described below with reference to the drawings. Naturally enough, the present invention is not limited by the embodiments shown below.

First Embodiment

In the present embodiment, description will be given of an example in which the present invention is applied to a case where a photo mask for a bit line contact (CB) layer of a NAND flash memory is projected and exposed, the photo mask having, as a part of the whole pattern, holes arranged contiguously in one-dimensional direction.

Figure 1:
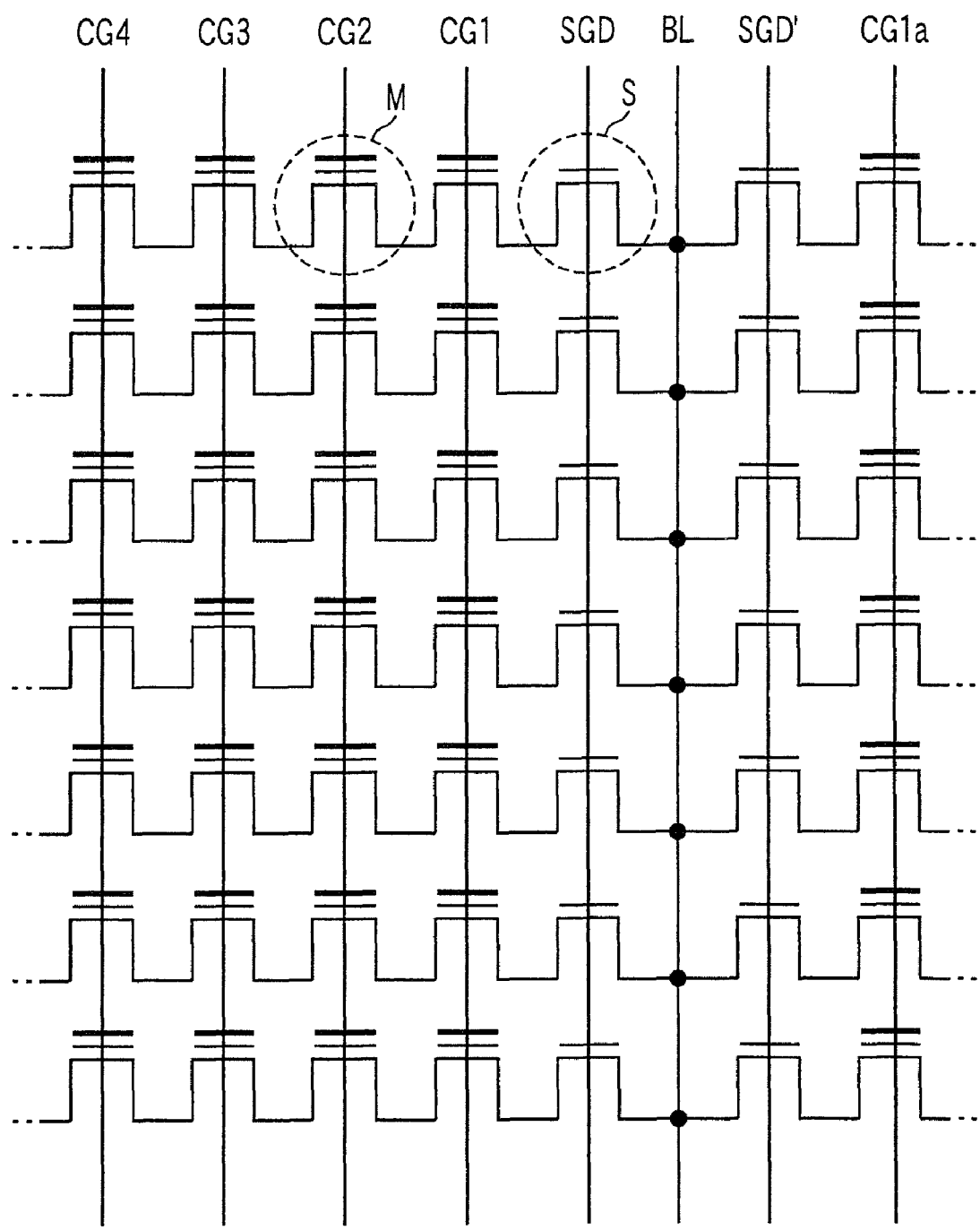
FIG. 1 is a diagram schematically showing a circuit in a NAND type flash memory according to a first embodiment.

FIG. 1 schematically shows a circuit in the NAND type flash memory.

As shown in FIG. 1, each NAND type flash memory is composed of nonvolatile semiconductor memory cells M are connected together in series. One end of the NAND type flash memory is connected to a bit line BL via a section transistor S connected to a selection gate line SG (SG1 or SG1'). Each memory cell is connected to a control gate line (CG1 to CG4, CG1'). The other end (not shown) of the flash memory is connected to a common source line via a selection transistor connected to the selection gate line.

Figure 2:
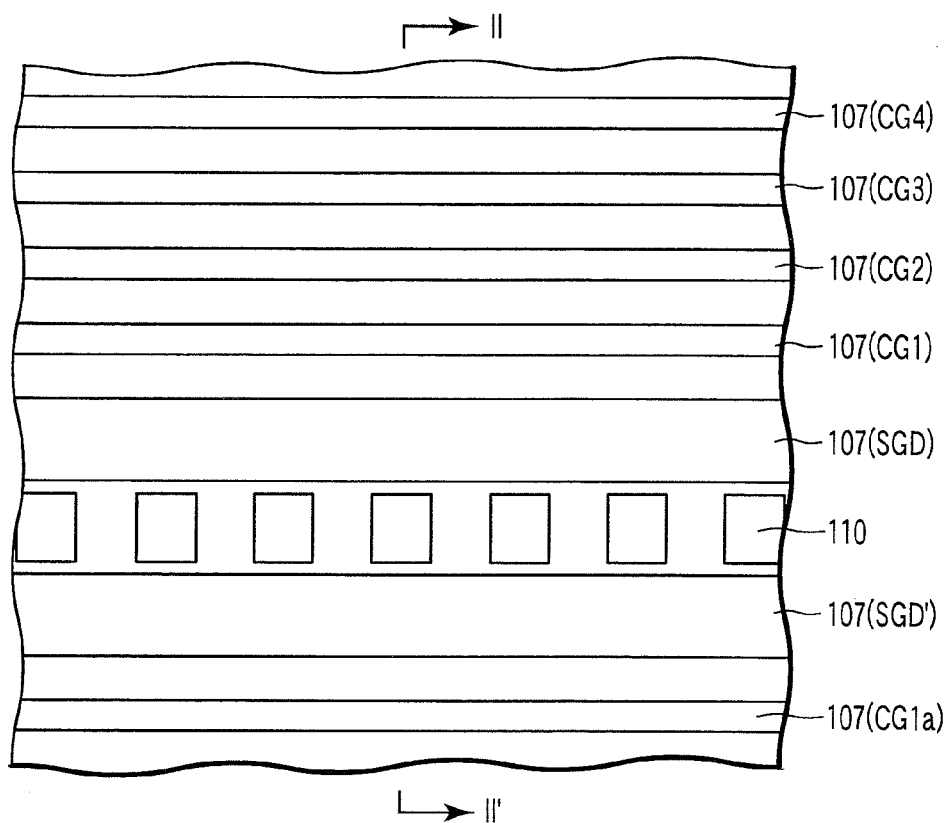
FIG. 2 is a plan view showing the configuration of the flash memory according to the first embodiment.
Figure 3:
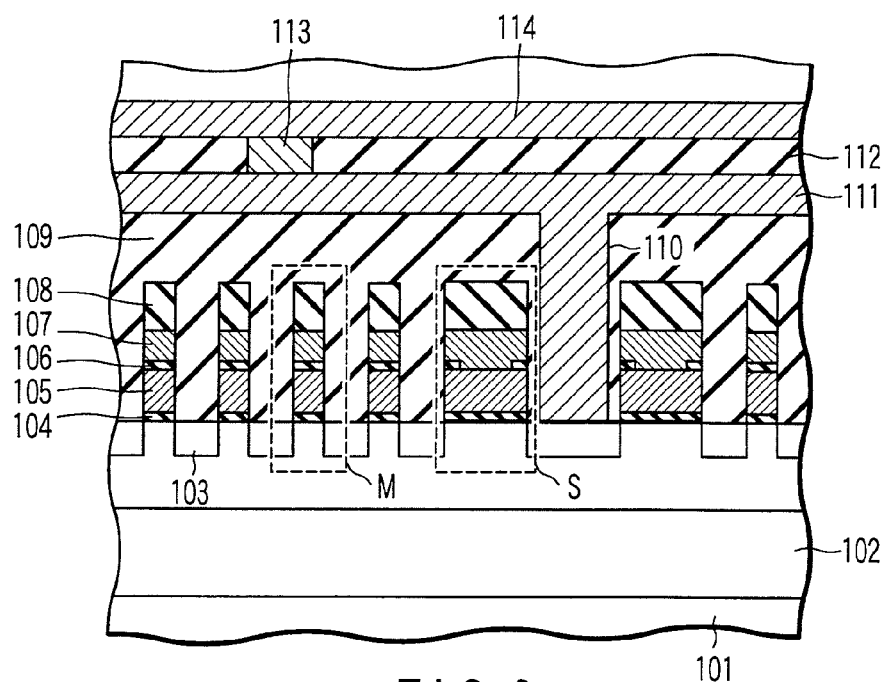
FIG. 3 is a sectional view showing the configuration of the flash memory according to the first embodiment.

FIG. 2 is a plan view of the NAND type flash memory. FIG. 3 shows a cross section of the flash memory taken along line II-II' in FIG. 2.

As shown in FIGS. 2 and 3, a p-type well 102 is formed on an n-type Si 102. An n-type diffusion layer 103 is formed in parts of the p-type well 102. The n-type diffusion layer 103 constitutes a source and a drain of the non-volatile memory cell M. A tunnel insulating film 104 is formed on a channel region. A floating gate 105 is formed on the tunnel insulating film 104. An inter-gate insulating film 106 is formed on the floating gate 105. A control gate 107 is formed on the inter-gate insulating film 106. In the selection transistor S, the inter-gate insulating film 106 is partly removed. Furthermore, the floating gate 105 and the control gate 107 are electrically connected together to constitute the selection gate SG.

An inter-layer insulating film 109 is formed on the Si substrate 101. A contact hole 110 is formed in the inter-layer insulating film 109 so as to connect to the n-type diffusion layer 103 located between the two selection transistors S. A bit line contact 111 is formed in the bit line contact hole 110 and on the inter-layer insulating film. A second inter-layer insulating film 112 is formed on the bit line contact 111. A via plug 113 is formed in a hole formed in the second inter-layer insulating film 112. A bit line 114 is formed on the second inter-layer insulating film 112 so as to connect to the via plug 113.

As shown in FIG. 2, the longitudinal dimension of the bit line plug hole significantly affects a chip size. The chip size and thus chip costs decrease consistently with the longitudinal dimension of the bit line plug hole. It is thus important to improve the resolution of the bit line contact, provide dimensional controllability, and reduce the longitudinal dimension.

Figure 4A:
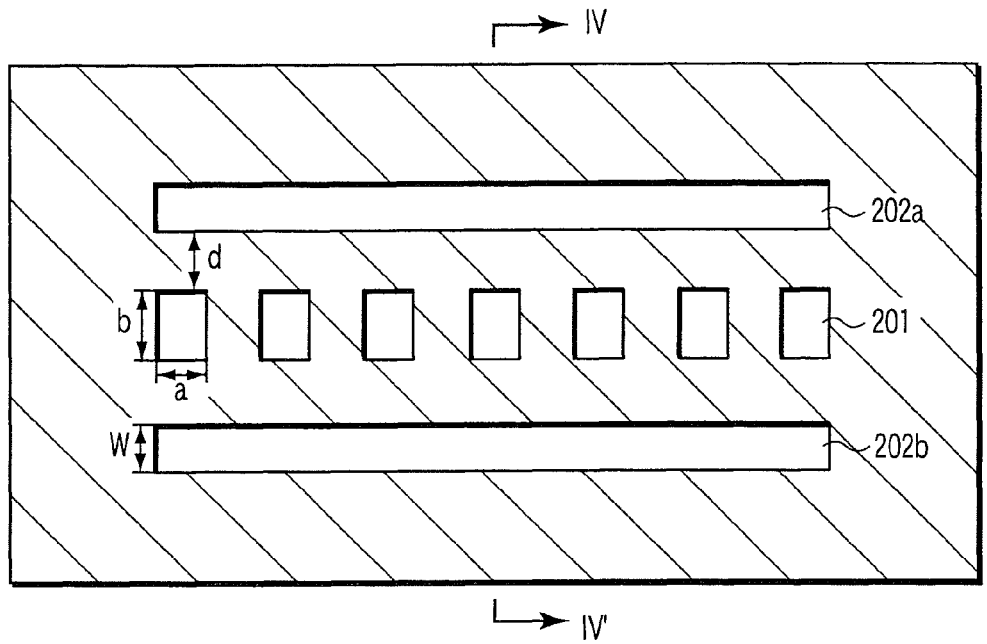
FIGS. 4A and 4B are a diagram schematically showing the configuration of the flash memory according to the first embodiment.
Figure 4B:
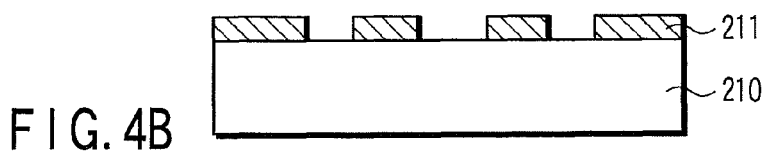

In the present embodiment, a mask is designed so that the bit line contact hole has a pitch of 145 nm and that the short side of one hole is 72.5 mm. FIGS. 4A and 4B are a diagram showing the configuration of a mask according to a first embodiment of the present invention. FIG. 4A is a plan view of the mask, and FIG. 4B is a sectional view of the mask taken along line IV-IV' in FIG. 4A.

As shown in FIG. 4A, three or more hole patterns 201 are arranged along one direction. Each of the hole patterns 201 is a rectangular of size a=50 nm×b=350 nm. An assist pattern 202 (202a and 202b) of width W 50 nm is formed at a distance d of 300 nm from the hole patterns 201 in a direction orthogonal to the direction in which the hole patters 201 are arranged (the one direction). The assist pattern 202 is not transferred to the substrate when it is exposed using an exposure apparatus in which the mask is mounted. The assist pattern has a length equivalent to or larger than that of the hole pattern row in the one direction. The long side of the assist pattern (in its longitudinal direction) is substantially parallel with the arrangement direction. As shown in FIG. 4B, the hole pattern 201 and the assist patterns 202a and 202b are surrounded by a semi-transparent film 211 formed on a transparent substrate 210.

If the assist pattern 202 has a width W larger than 0.3×λ/numerical aperture NA (in the present embodiment, 68 nm), then it is undesirably likely to be transferred.

Figure 5:
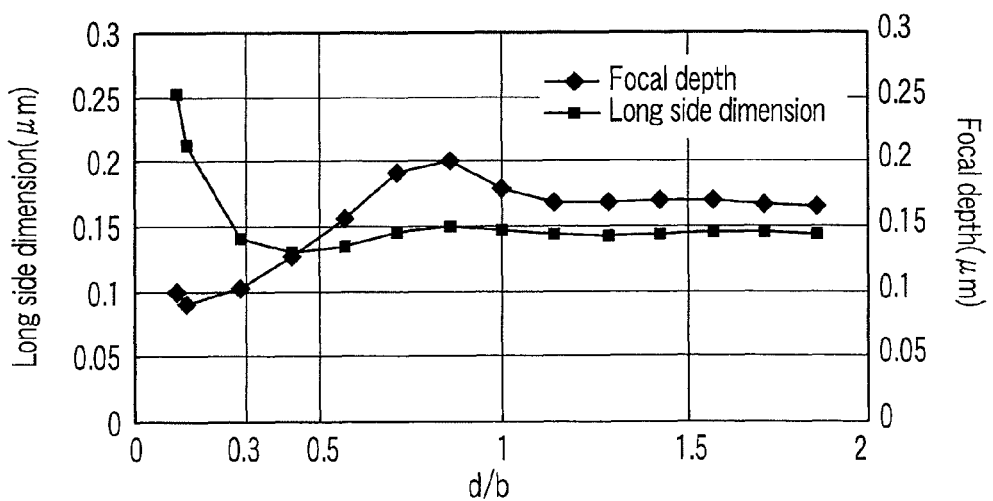
FIG. 5 is a graph showing the dependence of a focal depth and a longitudinal dimension on a gap d/length b.

As shown in FIG. 5, if a gap d is less than 0.3×b the length b of the hole pattern, then it is larger than a target dimension (0.15 μm). This is not preferable. Accordingly, the gap d is at least 0.3×b with respect to the length b. If the gap d is larger than 1.5×b, a focal depth may undesirably be excessively short. Moreover, the relationship between the gap d and the length b is preferably 0.5×b≦d≦1.0×b, which results in a sufficiently large focal depth. FIG. 5 is a graph showing the dependence of the focal depth and longitudinal dimension on the gap d/length b.

The suitable illumination depends on whether the patterns are sparsely or densely arranged. For the bit line contact hole, the patterns are densely arranged in the short side direction but are sparsely arranged in the long side direction. In a photo mask having the assist patterns 402 shown in FIG. 17, the patterns are dense in the arrangement direction and in the direction perpendicular to the arrangement direction but are sparse in oblique directions.

In the mask according to the present embodiment, the assist patterns, which are not transferred, are arranged adjacent to each other in the longitudinal direction. Consequently, the patterns are also densely arranged in the oblique directions. As a result, the mask is suitable for an illumination condition for the case in which the patterns are densely arranged. This improves resolution and the focal depth.

The illumination condition for the case in which the patterns are densely arranged is grazing incidence illumination. With reference to FIGS. 6 to 8, description will be given of the reason why the grazing incidence is suitable for dense patterns. FIGS. 6A and 6B are a diagram showing how diffracted light is generated from the dense patterns and formed into an image. FIG. 6A shows a case of vertical illumination. FIG. 6B shows a case of grazing incidence illumination. As shown in FIG. 6A, with the vertical illumination, ±1st-order lights have an angle larger than the NA of a projection lens. Only 0th-order light reaches a wafer. As shown in FIG. 6B, with the grazing incidence illumination, an image can be formed on the wafer provided that 0th-order light and 1st-order light pass through the projection optical system. Consequently, the grazing incidence illumination enables a limited resolution to be improved.

FIGS. 7A and 7B are a diagram illustrating the principle of improvement of the focal depth using the grazing incidence illumination. FIG. 7A shows how the vertical illumination is diffracted and formed into an image. FIG. 7B shows how the grazing incidence illumination is diffracted and formed into an image. The pitch of the mask is defined as P, and a wavelength is defined as λ. Furthermore, the angle between the 0th-order light and 1st-order light passing through the mask is defined as θ, and the numerical aperture of the lens is defined as NA. Then the relationship P=λ/sin θ=λ/NA. As shown in FIGS. 7A and 7B, if the illumination is changed to the grazing incidence with the pitch of the mask remaining unchanged, then the focal depth is improved compared to the vertical illumination. This is because the angle between 1st-order diffracted light and 0th-order diffracted light is small.

FIG. 8 is a diagram illustrating the principle of improvement of the resolution using the grazing incidence illumination. As shown in FIG. 8, the value θ and the resolution increase consistently with the pitch.

Simulation was executed to determine a resist pattern formed if the mask in which the continuous assist patterns are formed is used to expose resist. Then, optimum exposure conditions were determined. In the simulation, a spatial image was calculated for the mask pattern. Then, the effect of a resist process was loaded using a convolution integral of a Gaussian function (σ=ΔL), to calculate the resist pattern. The effect of the resist process was predetermined by fitting simulation results to experimental results. ΔL=45 nm.

Figure 9A:
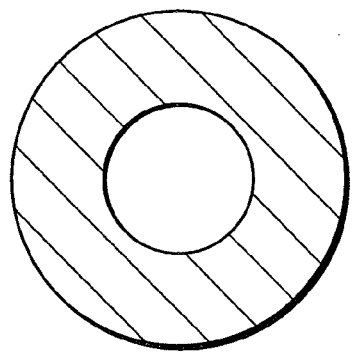
FIGS. 9A to 9F are a plan view showing the configurations of apertures (illumination condition)
Figure 9B:
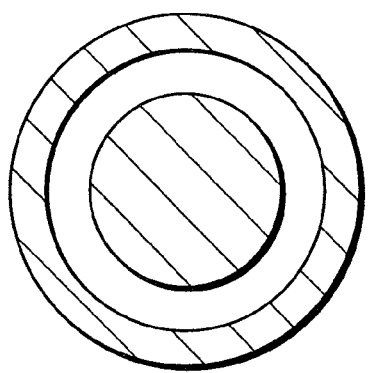
Figure 9C:
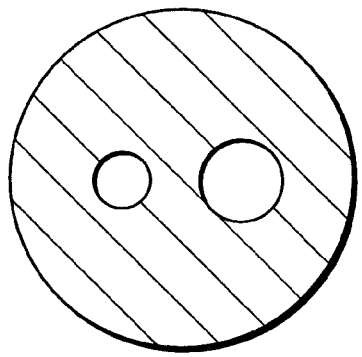
Figure 9D:
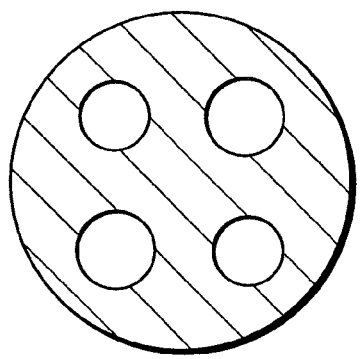
Figure 9E:
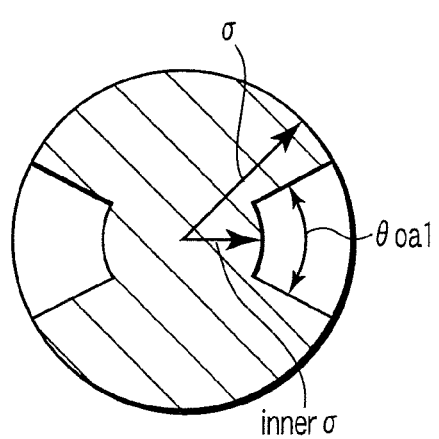
Figure 9F:
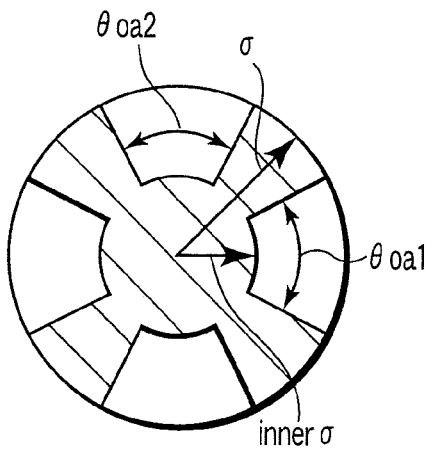
Figure 10:
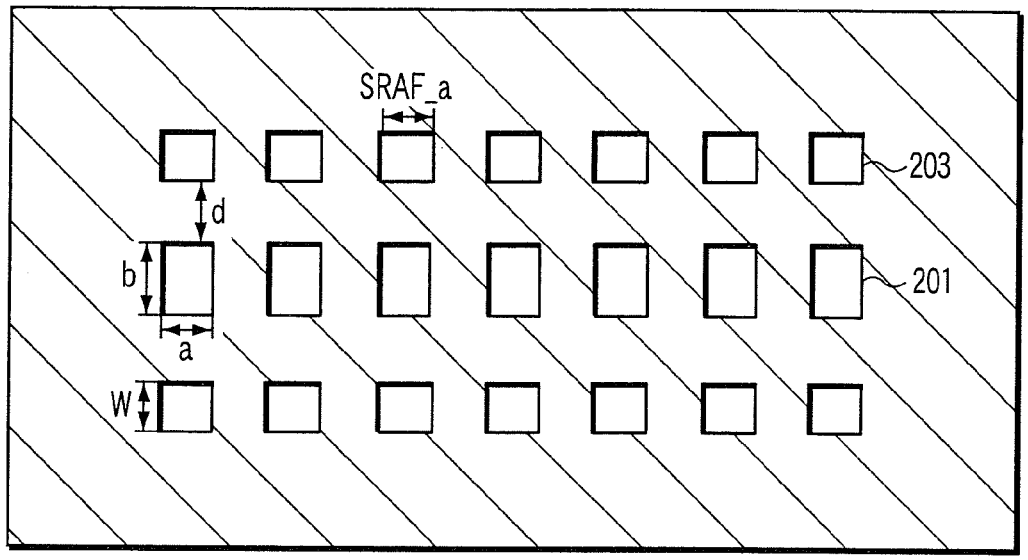
FIG. 10 is a plan view showing the configuration of a photo mask used for simulation.

The wavelength λ of an illuminating light source was set at 193 nm. Comparative examinations were made by varying the numerical aperture NA and the aperture of the illuminating optical system (illumination conditions). FIGS. 9A to 9F show the configuration of the aperture used for the simulation. FIG. 9A shows normal illumination and FIG. 9B shows zone illumination. FIG. 9C shows two-pole illumination and FIG. 9D shows four-pole illumination. FIG. 9E shows two-blank-sector illumination and FIG. 9F shows four-blank-sector illumination. Furthermore, the numerical aperture was set at 0.68, 0.78, or 0.85. For the two-pole illumination, the diameters of two openings formed in the aperture may be varied depending on the conditions. Likewise, for the four-pole illumination, the diameters of openings formed in the aperture may be varied depending on the conditions. Furthermore, although the figures show four-rotation symmetry, two-rotation symmetry may be used.

The results of the simulation indicated that the optimum numerical aperture was 0.85 and that the two-blank-sector illumination was optimum for the aperture of the illumination system. The parameters for the two-blank-sector illumination were set as follows: σ=0.9, Innerσ=0.6, and θoal=30 [deg]. The openings were arranged so that the mask would be illuminated obliquely with respect to the short side direction of the arrangement direction. This configuration improved the resolution of the bit line contact hole. It was also possible to form contiguous hole patterns having a pitch of 145 nm and a long side dimension of 150 nm. In this connection, varied illumination methods other than the two-blank-sector illumination have large margins. Accordingly, other varied illumination methods may be used.

Lithography simulation was executed by varying the width of an assist pattern 203 step by step until it is connected to its adjacent assist pattern 203. The patterns other than the assist patterns 203, that is, the patterns 201 have dimensions similar to those shown in FIGS. 4A and 4B.

Figure 11:
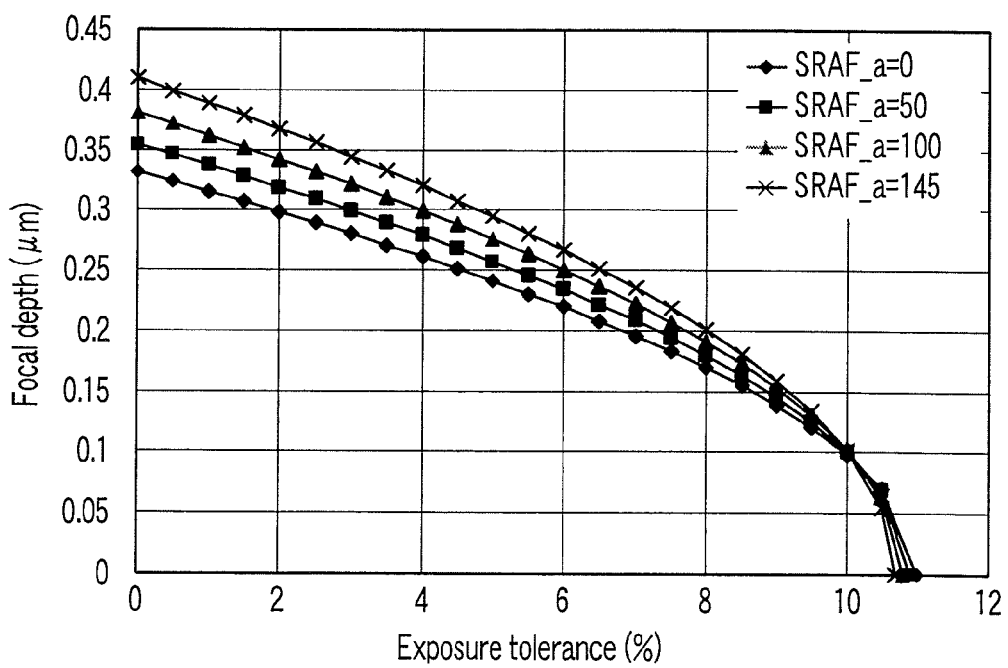
FIG. 11 is a graph showing the relationship between a Exposure tolerance and the focal depth.

The illumination condition was the two-blank-sector illumination and the numerical aperture was 0.85. The results of the simulation are shown in FIG. 11. Furthermore, Table 1 shows a summary of the results of the simulation. Table 1 shows the focal depth observed when a exposure tolerance is 8%.

TABLE 1

| Assist pattern width [nm]<br>SRAF_a | Focal depth DOF [nm] |
|---|---|
| 0<br>(No assist) | 169 |
| 50 | 180 |
| 100 | 191 |
| 145<br>(Continuous) | 201 |

This indicates that the assist patterns according to the present embodiment provide the largest lithography margin.

Second Embodiment

Figure 12A:
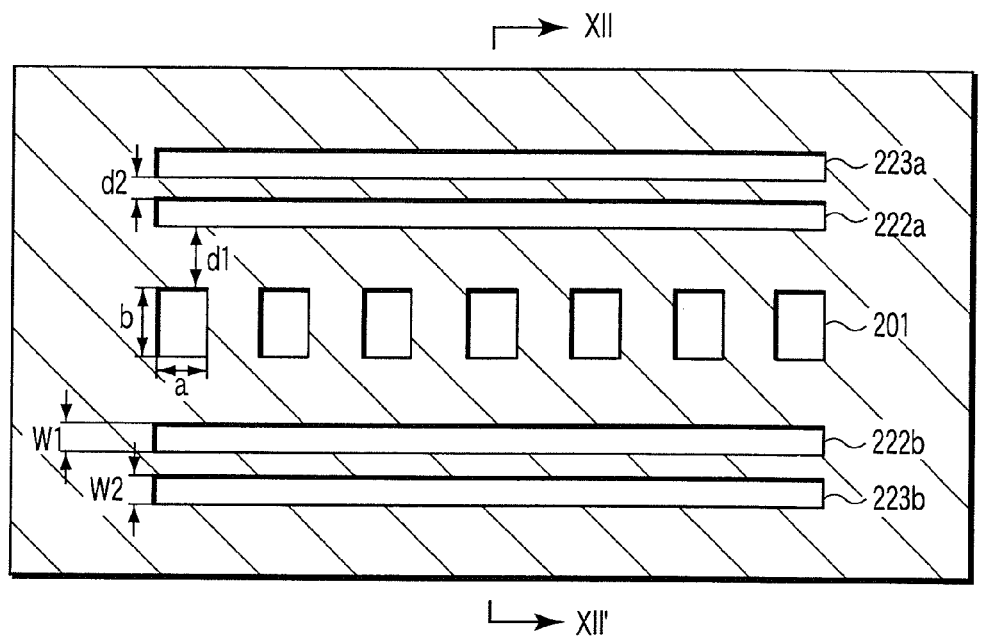
FIGS. 12A and 12B are a diagram showing the configuration of a mask according to a second embodiment.
Figure 12B:
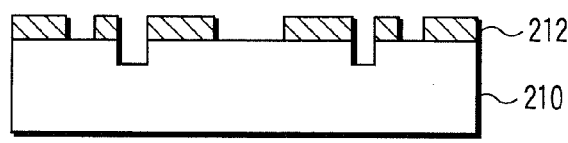

FIG. 12A is a plan view of the mask. FIG. 12B is a sectional view of the mask taken along line XII-XII' in FIG. 12A. This mask is used to form bit line contact holes of a NAND type flash memory.

FIGS. 12A and 12B are a diagram showing the configuration of a mask according to a second embodiment of the present invention. There or more hole patterns 201 are arranged along one direction. Each of the hole patterns 201 is a rectangular of size a=40 nm×b=200 nm. A second assist pattern 222 (222a and 222b) of width W 50 nm is formed at a distance d of 300 nm from the hole patterns 201 in a direction orthogonal to the direction in which the hole patters 201 are arranged (the one direction). The second assist pattern 222 is not transferred to the substrate when it is exposed using the exposure apparatus in which the mask is mounted. At the second assist pattern, the transparent substrate 210 is dug. As a result, there is a phase difference of 180 0 between light transmitted through the second assist pattern 222 and light transmitted through the hole pattern 201. A first assist pattern 223 (223a and 223b) of width W 50 nm is formed at a distance d of 300 nm from the second assist pattern 222 in the direction orthogonal to the direction in which the hole patterns 201 are arranged (the one direction). The first assist pattern 223 is not transferred to the substrate when it is exposed using the exposure apparatus in which the mask is mounted. Light transmitted through the first assist pattern 223 and light transmitted through the hole pattern 201 are in phase.

Exposure was carried under the same illumination conditions as those in the first embodiment. Then, it was able to form contiguous hole patterns having a pitch of 145 nm and a long side dimension of 130 nm.

Figure 13A:
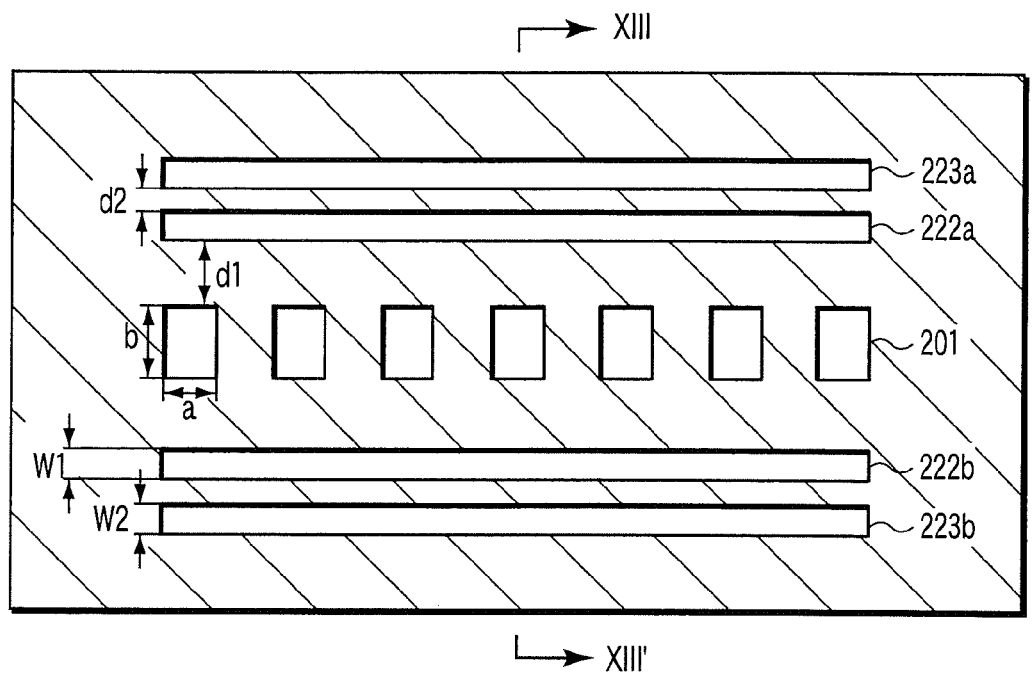
FIGS. 13A and 13B are a diagram showing the configuration of a mask according to a second embodiment.
Figure 13B:
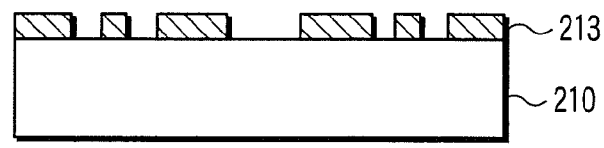

In addition, although the Levenson type photo mask was shown in FIGS. 12A and 12B, a half-tone type photo mask shown in FIGS. 13A and 13B may be used to form bit line contact holes of a NAND type flash memory. FIG. 13A is a plan view of the mask. FIG. 13B is a sectional view of the mask taken along line XII-XII' in FIG. 13A. In FIG. 13B, a notation 213 is a semitransparent film.

Third Embodiment

In the present embodiment, the dimensions of each of the photo masks shown in FIGS. 4 and 12 were optimized to compare their long side dimensions with each other. Table shows the dimensions of each of the optimized photo masks.

TABLE 2

| Assist pattern shape | a | b | W/W1 | d/d1 | W2 | d2 |
|---|---|---|---|---|---|---|
| None | 56 | 370 | — | — | — | — |
| Isolated assist pattern | 60 | 300 | 50 | 50 | — | — |
| Continuous assist pattern (one) | 50 | 350 | 50 | 300 | — | — |
| Continuous assist pattern (two) | 40 | 200 | 50 | 200 | 50 | 50 |

Simulation was executed under illumination conditions were similar to those in the first embodiment to determine the long side dimensions. Table 3 shows the long side dimensions of the hole formed at an exposure tolerance of 8% and a focal depth of 0.2 μm.

TABLE 3

| Assist pattern shape | Long side dimension [nm] |
|---|---|
| None | 160 |
| Isolated assist pattern | 157 |
| Continuous assist pattern (one) | 150 |
| Continuous assist pattern (two) | 133 |

Table 3 indicates that the long side dimension can be reduced using the continuous assist pattern, particularly the two continuous assist patterns.

Fourth Embodiments

In the present embodiment, description will be given of a method of generating data on a mask having the above continuous assist pattern. FIGS. 14A to 14F are a diagram illustrating a method of generating data according to a fourth embodiment of the present invention.

Figure 14E:
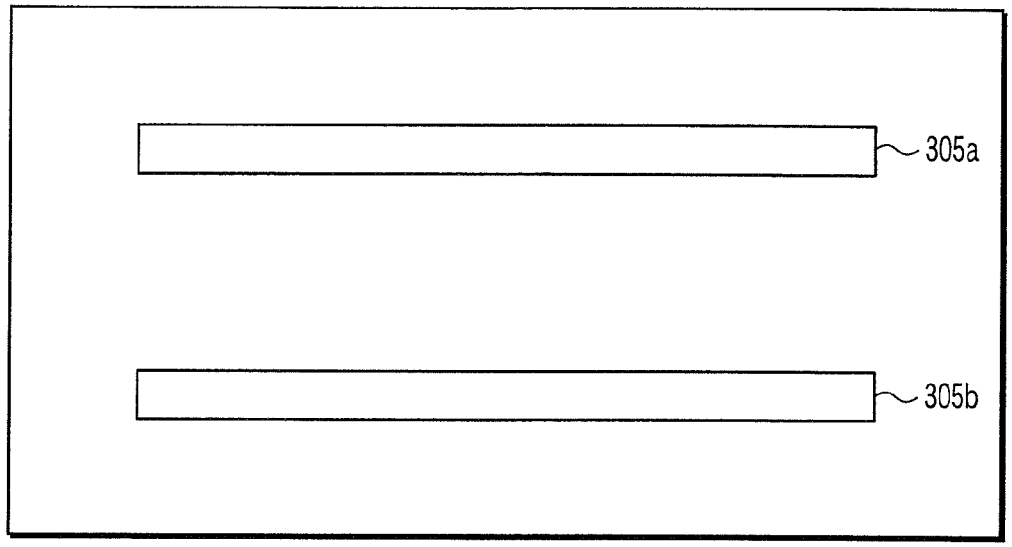
Figure 14F:
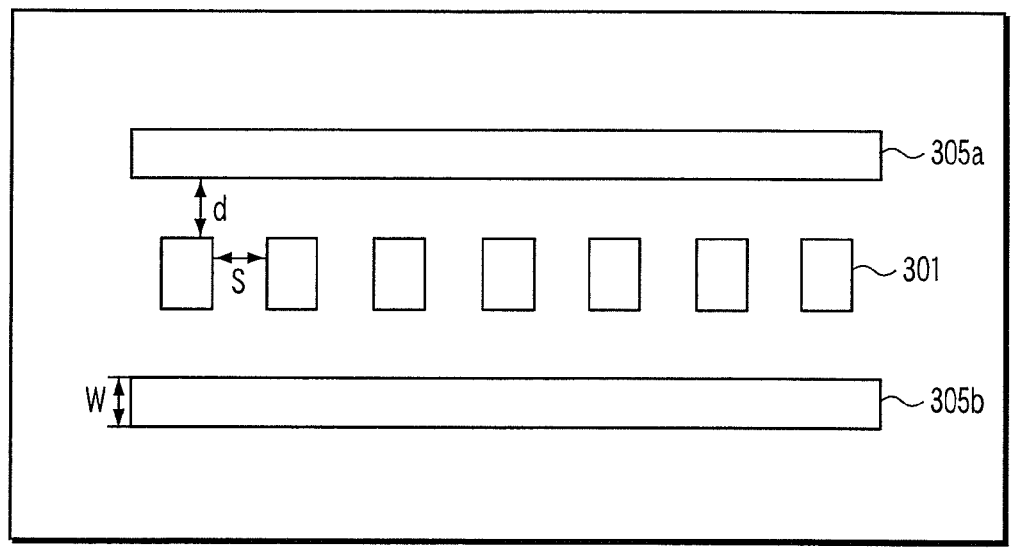

First, as shown in FIG. 14A, design data is provided which indicates that there is a spacing S between adjacent hole patterns 301 and that three or more hole pattern data are arranged in one direction. Then, as shown in FIG. 14B, a resizing process is executed to extend each hole pattern 301 by an amount S/2 rightward and leftward in an x direction. Thus, the adjacent patterns are joined together to create a pattern 302. Then, as shown in FIG. 14C, a resizing process is executed to extend the pattern 302 by an amount d (the distance between the main pattern and assist pattern)+W (the width of the assist pattern) upward and downward in a y direction to create a pattern 303. Then, as shown in FIG. 14D, a resizing process is executed to shrink the pattern 303 upward and downward in the y direction to generate a pattern 304. Then, as shown in FIG. 14E, differential patterns 305a and 305b between the pattern 303, shown in FIG. 14C, and the pattern 304, shown in FIG. 14D, are extracted. As shown in FIG. 14F, the pattern 301, shown in FIG. 14A, is merged with the patterns 305a and 305b, shown in FIG. 14E. The above process enables the designing of a hole pattern having a continuous assist pattern.

Fifth Embodiment

In the present embodiment, description will be given of a method of generating data on a mask having a continuous assist pattern. FIGS. 15A to 15F are a diagram illustrating a method of generating data according to a fifth embodiment of the present invention.

Figure 15C:
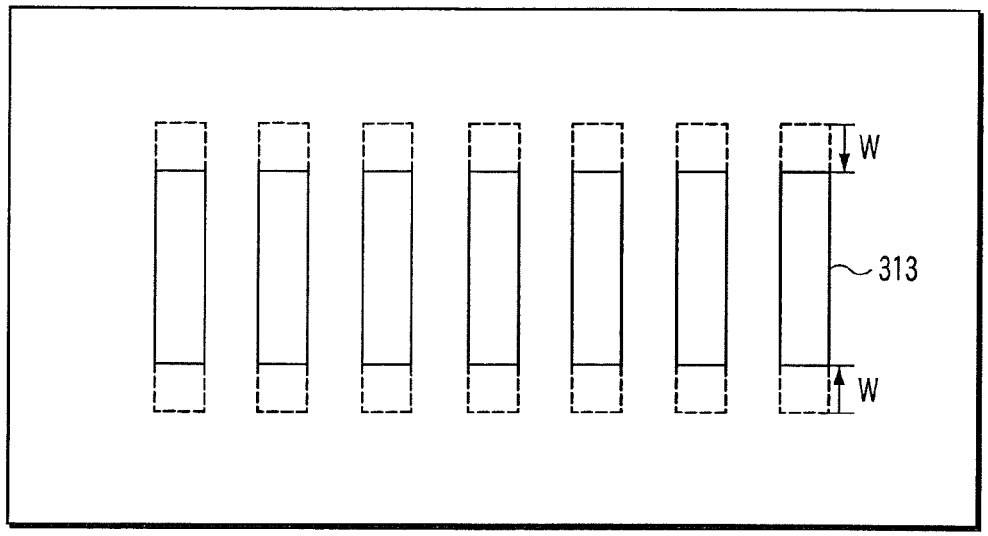
Figure 15D:
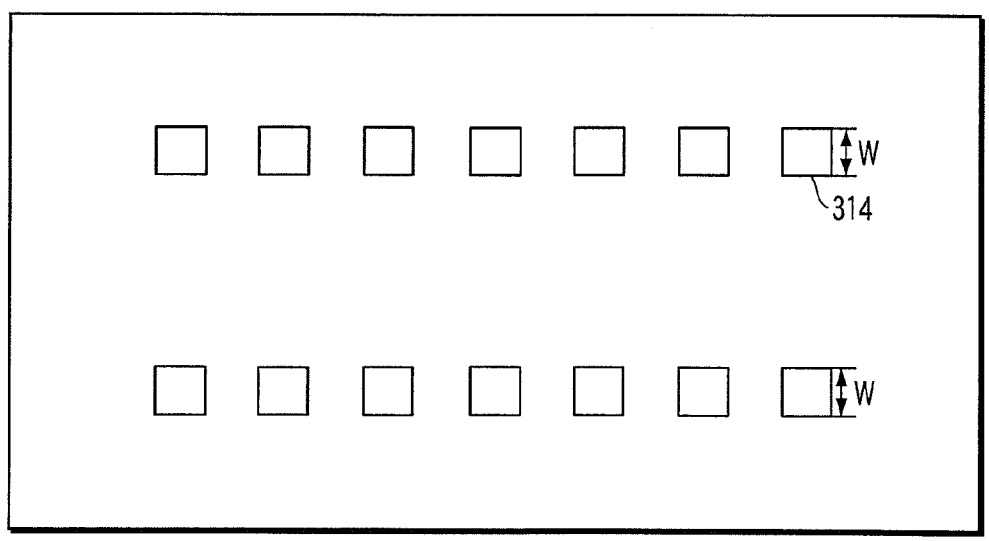
Figure 15E:
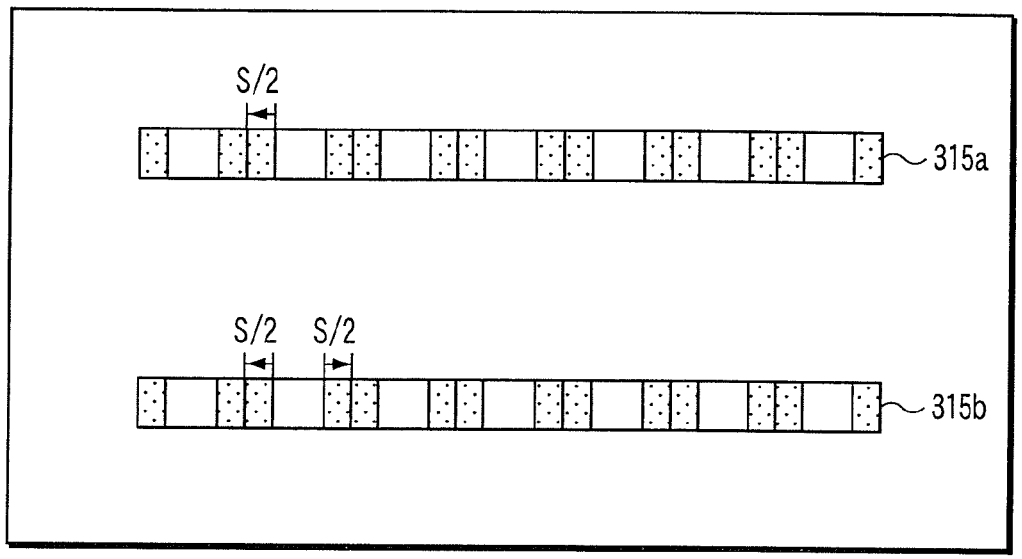
Figure 15F:
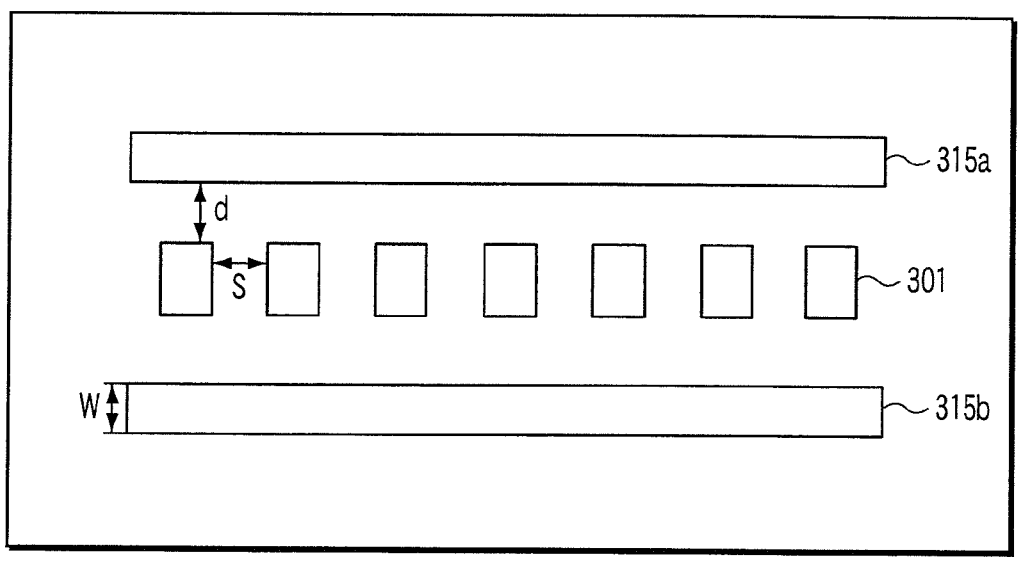

First, as shown in FIG. 15A, design data is provided which indicates that there is a spacing S between adjacent hole patterns and that three or more hole patterns (width a) 301 are arranged in one direction. Then, as shown in FIG. 15B, a resizing process is executed to extend the patterns 301 by an amount d (the distance between the main pattern and assist pattern)+W (the width of the assist pattern) upward and downward in the y direction to generate patterns 312. Then, as shown in FIG. 15C, a resizing process is executed to shrink the patterns 312 upward and downward in the y direction to generate patterns 313. Then, as shown in FIG. 15D, a differential pattern 314 between each pattern 312, shown in FIG. 15B, and the corresponding pattern 313, shown in FIG. 15C, is extracted. Then, as shown in FIG. 15E, a resizing process is executed to extend each pattern by an amount S/2 rightward and leftward in the x direction to generate patterns 315a and 315b. As shown in FIG. 15F, the pattern 301, shown in FIG. 15A, is merged with the patterns 315a and 315b, shown in FIG. 15E. The above process enables the designing of a hole pattern having a continuous assist pattern.

Sixth Embodiment

In view of the above described problems, the inventor invented a method of arranging assist patterns in a phase shift mask with respect to hole patterns not having periodicity Description will be given of a phase shift mask according to embodiments of the present invention and the formation of hole patterns using the phase shift mask.

Figure 16:
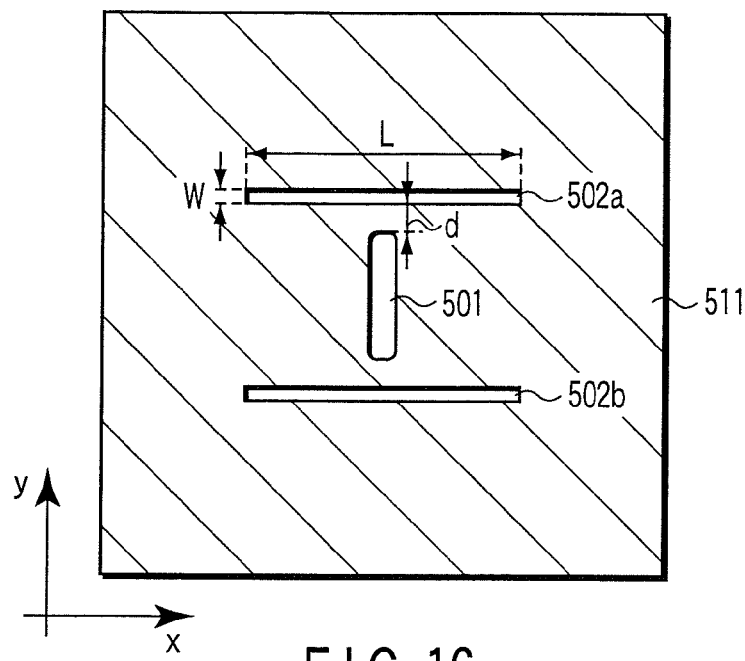
FIG. 16 is a plan view showing the configuration of a phase shift mask formed with an assist pattern according to a sixth embodiment.

FIG. 16 is a plan view showing the configuration of a phase shift mask according to a sixth embodiment of the present invention. As shown in FIG. 16, a main pattern 501 and an assist pattern 502 (502a and 502b) are surrounded by a semi-transparent film 511. The semitransparent film 511 is formed on a transparent substrate (not shown). The semitransparent film has a light transmittance of 6%. Light transmitted through the semitransparent film is 180 0 out of phase compared to light transmitted through the hole pattern 501 and assist patterns 502a and 502b. The phase shift mask is mounted in an exposure apparatus with an exposure wavelength λ and a numerical aperture NA. With this phase shift mask, the patterns are preferably transferred to the substrate using grazing incidence illumination.

The main pattern 501 is located so as not have periodicity with respect to any patterns that lie adjacent to the main pattern 501 and that are transferred to the substrate if it is exposed using the exposure apparatus in which the phase shift mast is mounted. The main pattern 501 is shaped like a rectangle with rounded corners. The main pattern 501 has a latitudinal direction in the x direction and a longitudinal direction in the y direction.

The assist patterns 502a and 502b are arranged close to one end of the main pattern in the longitudinal direction. The assist pattern 502 is not transferred to the substrate if it is exposed using the exposure apparatus in which the phase shift mast is mounted. The length L of the assist pattern 502 in the x direction is sufficiently larger than the width of the main pattern 501 in the x direction.

Figure 17:
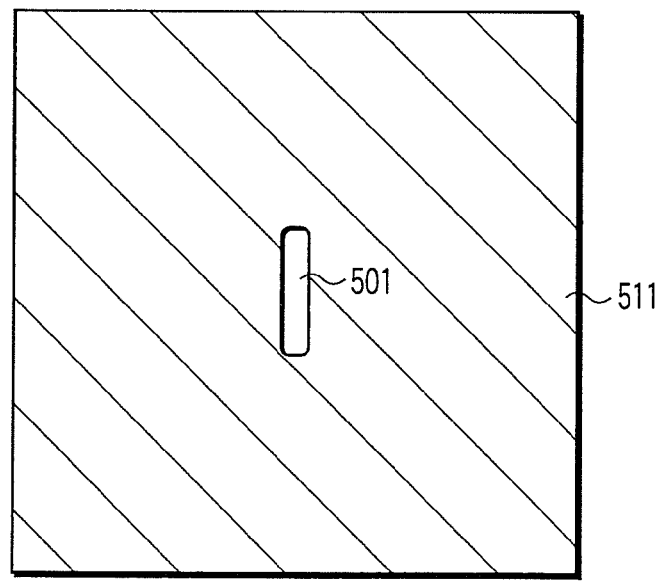
FIG. 17 is a plan view showing the configuration of a phase shift mask not formed with any assist patterns.
Figure 18:
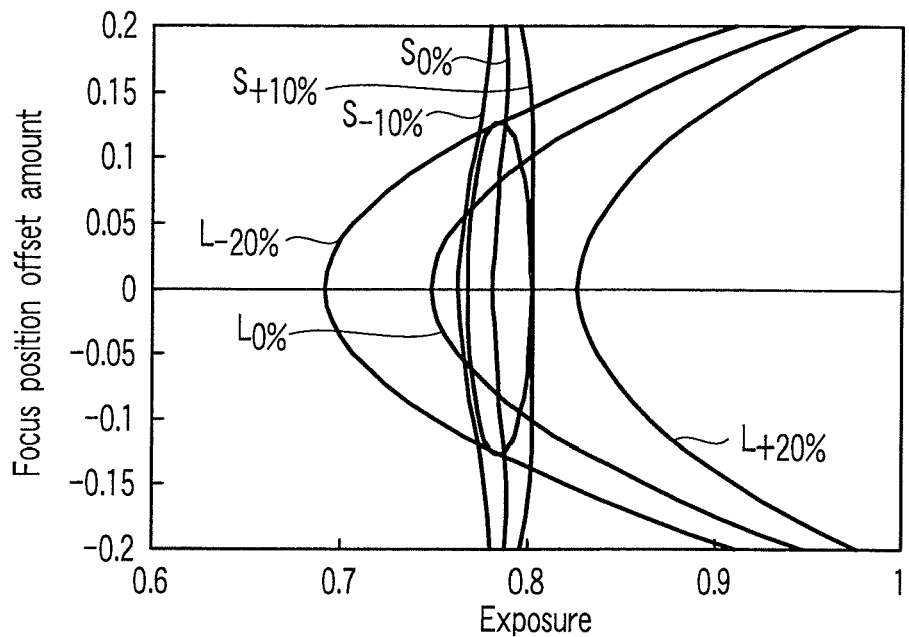
FIG. 18 is a graph showing the results of ED-Tree analysis of the phase shift mask shown in FIG. 16.
Figure 19:
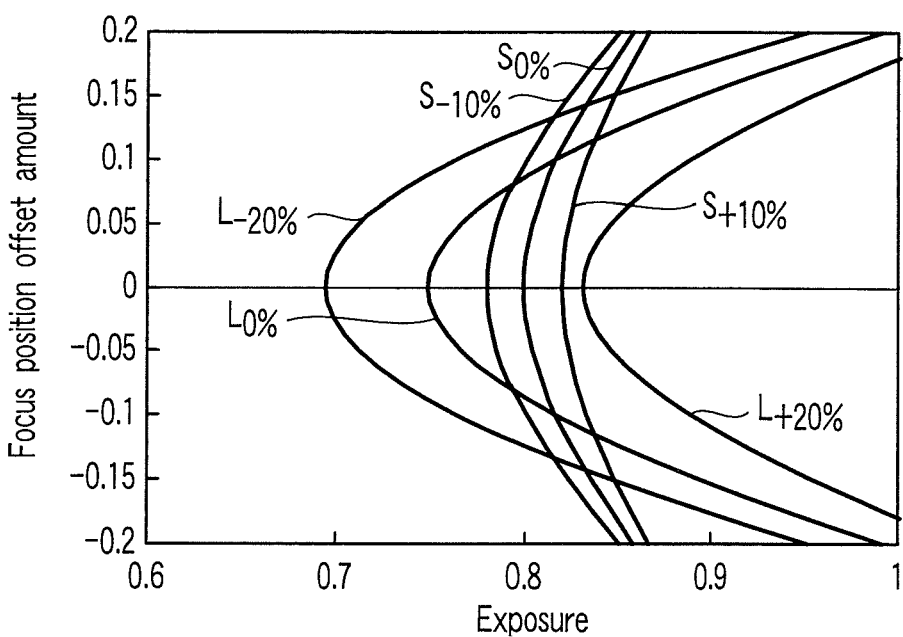
FIG. 19 is a graph showing the results of ED-Tree analysis of the phase shift mask shown in FIG. 17.

If the with of the assist pattern 502 in the y direction is larger than 0.27× the exposure wavelength λ/the numerical aperture NA, the assist pattern is undesirably likely to be transferred. The phase shift mask with the assist pattern was subjected to ED-Tree analysis. Furthermore, ED tree analysis was performed on a phase shift mask in which only the main pattern 501 is formed as shown in FIG. 17. FIGS. 17 and 18 show the results of the ED-Tree analysis. FIG. 18 shows the results of the ED-Tree analysis of the phase shift mask in which the assist pattern is formed as shown in FIG. 16. FIG. 19 shows the results of the ED-Tree analysis of the phase shift mask in which the assist pattern is not formed as shown in FIG. 17. In FIGS. 18 and 19, L−20%, L0%, and L+20% denote lines with which the length of the transferred main pattern 501 in the y direction is −20%, 0%, and +20% of a designed dimension. In FIGS. 18 and 19, L−10%, L0%, and L+10% denote lines with which the length of the transferred main pattern 501 in the x direction is −10%, 0%, and +10% of a designed dimension.

As shown in FIGS. 18 and 19, the presence of the assist margin reduces variations in dimensions when the side of the hole perpendicular to the assist pattern is defocused. This serves to improve the lithography margin.

The lithography margin was evaluated using the length L of the assist pattern 502 in the x direction as a parameter. The lithography margin is the focal depth observed at a focal tolerance of 8%. FIG. 20 is a graph showing the results of evaluation of the lithography margin. As shown in FIG. 20, when the assist pattern 502 has a length of about 1,000 nm, the lithography margin (focal depth) tends to be saturated.

With the phase shift mask with the assist pattern 502 and the phase shift mask without the assist pattern 502, the distribution of a light intensity on the substrate was simulated. FIG. 21 shows a standardized light intensity on the substrate obtained if the phase shift mask with the assist pattern 502 is used. FIG. 22 shows the standardized light intensity on the substrate obtained if the phase shift mask without the assist pattern 502 is used. The standardized light intensity is comparable between the phase shift mask with the assist pattern 502 and the phase shift mask without the assist pattern 502.

The light intensity on the substrate was simulated by transferring the pattern formed on the phase shift mask was transferred. FIG. 23 shows the distribution of the light intensity in the direction of the y axis. FIG. 23 shows the distribution of the light intensity of exposure light on the substrate in the direction of the y axis, the exposure light being transmitted through the phase shift mask. In FIG. 23, a peak B results from the assist pattern. When the light intensity of the peak B is high, the pattern is transferred to the wafer. Accordingly, the assist pattern width W must be optimized.

Simulation was executed using the assist pattern width W as a parameter to determine the ratio of the peak B to the peak A (B/A). Exposure conditions included an exposure wavelength of 193 nm and a numerical aperture NA of 0.85. FIG. 24 is a graph showing the relationship between the ratio of the peak B to the peak A (B/A) and the assist pattern width W. In this case, the assist pattern width W was 50 nm when the standardized exposure intensity was comparable to that obtained without the assist pattern.

Figure 26:
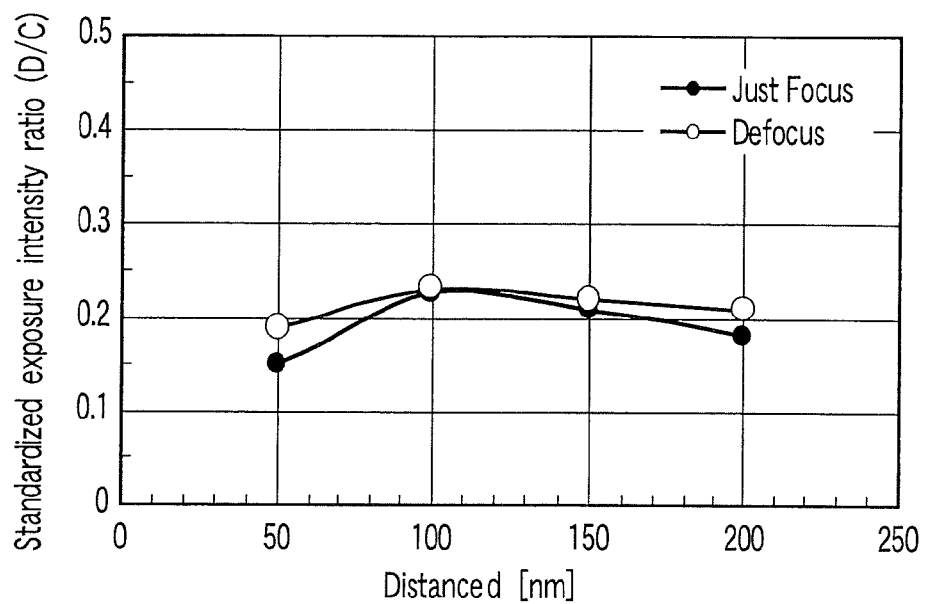
FIG. 26 is a graph showing the relationship between the ratio of a peak D to a peak C (D/C) and a distance d.

The light intensity on the substrate was simulated by transferring the pattern formed on the phase shift mask was transferred. FIG. 25 shows the distribution of the light intensity in the direction of the x axis. FIG. 25 shows the distribution of the light intensity of exposure light on the substrate in the direction of the x axis, the exposure light being transmitted through the phase shift mask. The distribution of the light intensity has peaks C and D. The peak C results from the main pattern. The peak D is expected to result from the assist pattern. Simulation was executed using the distance d between the main pattern and the assist pattern to determine the ratio of the peak D to the peak C (D/C). FIG. 26 is a graph showing the relationship between the ratio of the peak D to the peak C (D/C) and the distance d. As shown in FIG. 26, the ratio (D/C) varies with the distance. This indicates that the distance d must be optimized. In the present embodiment, the distance d between the assist pattern and the main pattern was 100 nm. However, Distance d is not limited to 100 nm and is at least 50 nm.

Seventh Embodiment

Figure 27:
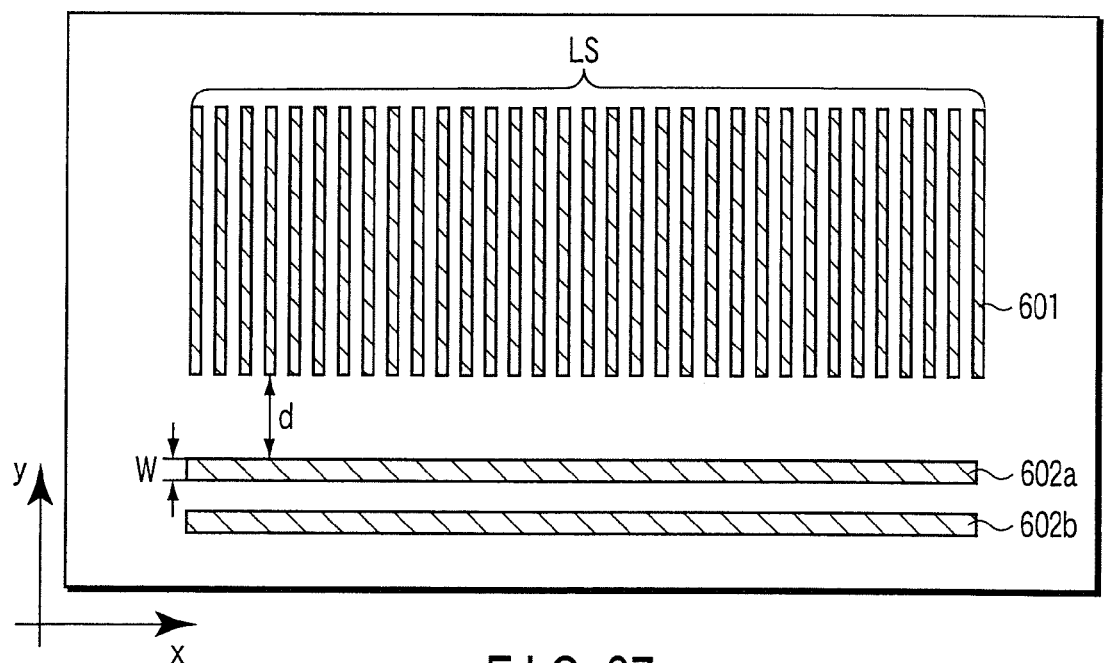
FIG. 27 is a plan view showing the configuration of a photo mask according to a seventh embodiment.

FIG. 27 is a plan view showing the configuration of a photo mask according to a seventh embodiment of the present invention. The dimensions of the photo mask shown in the present embodiment and each of the subsequent embodiments exhibit their values obtained when the photo mask is transferred to a substrate.

As shown in FIG. 27, a plurality of line patterns 601 are periodically arranged in the x direction. The plurality of line patterns 601 constitute an L/S pattern. Assist patterns 602a and 602b are arranged adjacent to one end of the line patterns 601 in the y direction. The assist patterns 602a and 602b have a length in the x direction which is equal to or larger than the length of the L/S pattern in the x direction. Even when used for the exposure apparatus used, the assist patterns 602a and 602b are not transferred to the substrate. It is undesirable that in connection with the numerical aperture NA, the width of the assist patterns 602a and 602b in the y direction is larger than 0.26×λ/NA (in the present example, 59 nm). This is because this dimension makes the assist patterns 602a and 602b more likely to be transferred to the resist on the substrate. The hole patterns 601 and the assist patterns 602a and 602b are each formed of a light shielding film formed on a transparent film. The hole patterns 601 and the assist patterns 602a and 602b may each be formed of a translucent film formed on a transparent film.

If the L/S pattern L and the assist patterns 602a and 602b are transferred to the resist film on the substrate using the exposure apparatus and are then developed, then it is possible to reduce the magnitude of shortening and thinning that may occur at the end of the line patterns formed. As a result, when a resist pattern is formed, the magnitude of a possible falling of the resist pattern can be reduced.

Moreover, although the assist pattern located close to one end of the line pattern 601 in the y direction, the assist pattern may located close to other end of the line pattern 601 in the y direction. Moreover, although two assist patterns 602a and 602b are arranged, only one assist pattern may be formed and three or more assist patterns may be arranged again. Moreover, distance d of the line pattern 601 and assist pattern 602a is preferably $0.5 \times b \leq d \leq 1.0 \times b$ larger than 50 nm.

Figure 28:
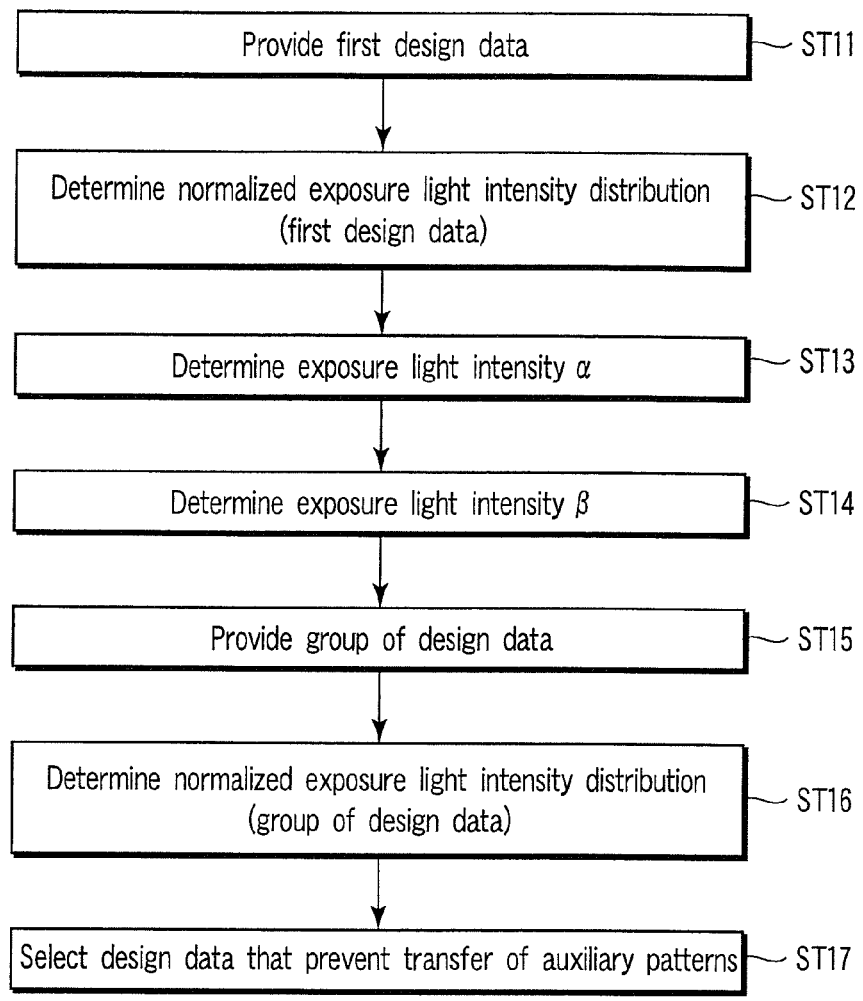
FIG. 28 is a flow chart showing the procedure of a method of generating design data according to the seventh embodiment.

Now, description will be given of a method of generating design data containing the assist patterns, from design data containing the L/S pattern. FIG. 28 is a flow chart showing the procedure of a method of generating design data according to the seventh embodiment of the present invention.

Figure 29:
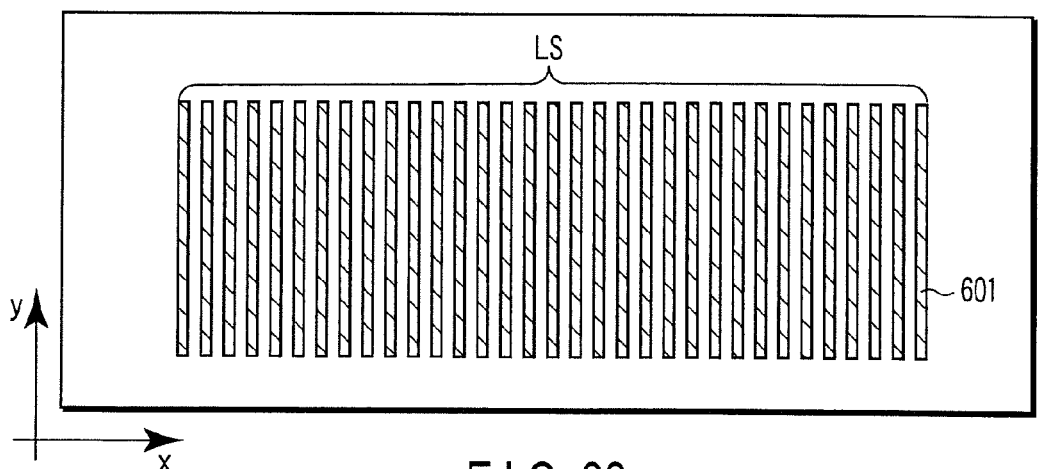
FIG. 29 is a diagram showing a line and space pattern.

First, first design data is provided which has the L/S pattern LS composed of the plurality of line patterns 601 shown in FIG. 29 (step ST11). In the pattern corresponding to the first design data, no assist patterns are arranged adjacent to the L/S pattern. Then, lithography simulation is executed to determine a normalized exposure light intensity distribution on a resist film obtained if the L/S pattern is transferred to the resist film (step ST12). FIG. 30 shows the determined normalized exposure light intensity distribution. FIG. 30 shows the normalized exposure light intensity distribution in the x direction.

An exposure light intensity α with which target pattern dimensions are obtained is determined from the normalized exposure light intensity distribution (step ST13). Further, an exposure light intensity β that is 20% higher than the exposure light intensity α is determined (step ST13). The exposure light intensity β corresponds to the upper limit value of an exposure amount margin.

Now, a plurality of design data (a group of design data) are provided in which the assist patterns 602 are arranged adjacent to the L/S pattern as shown in FIG. 27 (step ST15). The width W of the assist patterns in the x direction and the distance d between the L/S pattern and the assist patterns vary among the plurality of design data.

Lithography simulation is executed to determine a normalized exposure light intensity distribution on a resist film obtained if the patterns corresponding to each data are transferred to the resist film with the exposure light intensity β (step ST16). FIG. 31 shows the determined normalized exposure light intensity distribution. FIG. 31 shows the normalized exposure light intensity distribution in the y direction. In FIG. 31, a peak Pa corresponds to the assist pattern 602a. A peak Pb corresponds to the assist pattern 602b.

One of the design data is selected on the basis of the plurality of exposure light intensity distributions obtained (step ST17); with this design data, if the patterns are transferred with the exposure light intensity β, the assist patterns are not transferred to the resist. In the present embodiment, the following condition is set: the assist patterns are not designed if the peaks Pa and Pb exhibit the exposure light intensity β or higher.

The above process provides a design that allows the assist patterns to be arranged near the line end of the line patters, the main patterns.

Seventh Embodiment

Figure 32:
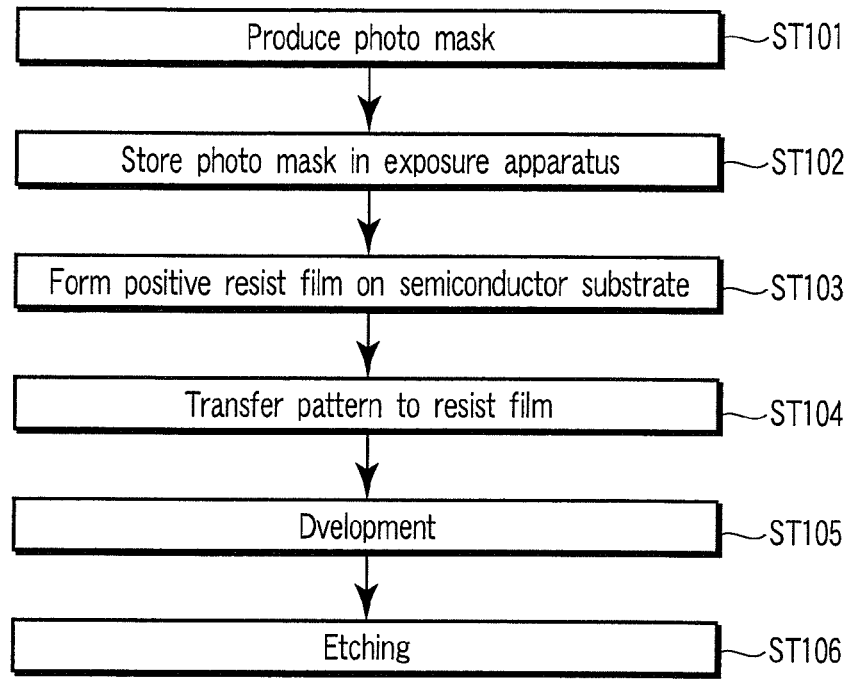
FIG. 32 is a chart showing the procedure of a method of manufacturing a semiconductor device according to a eighth embodiment.
Figure 33:
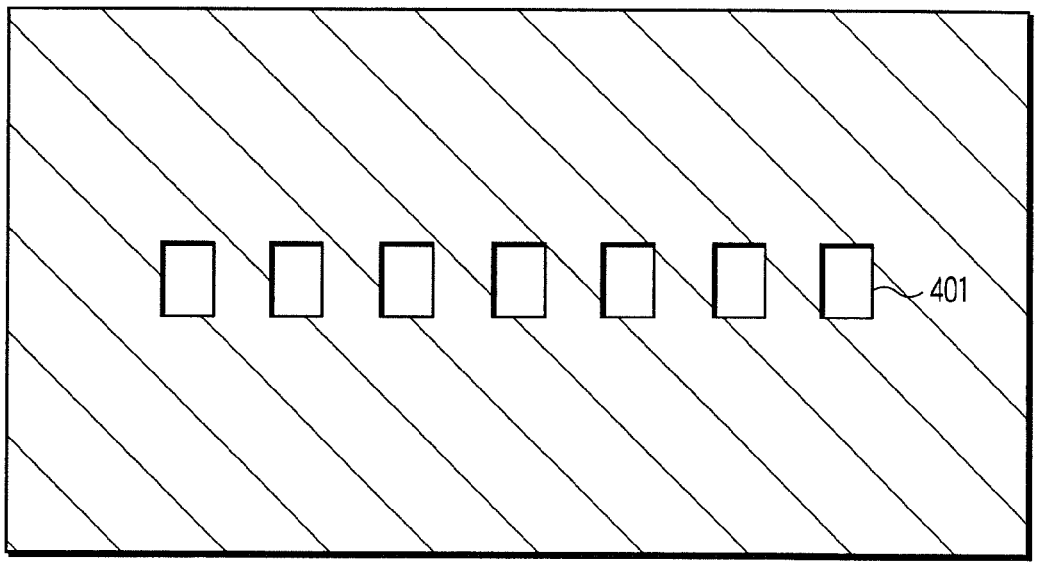
FIG. 33 is a plan view showing a pattern row having a plurality of hole patterns arranged along one direction.
Figure 34:
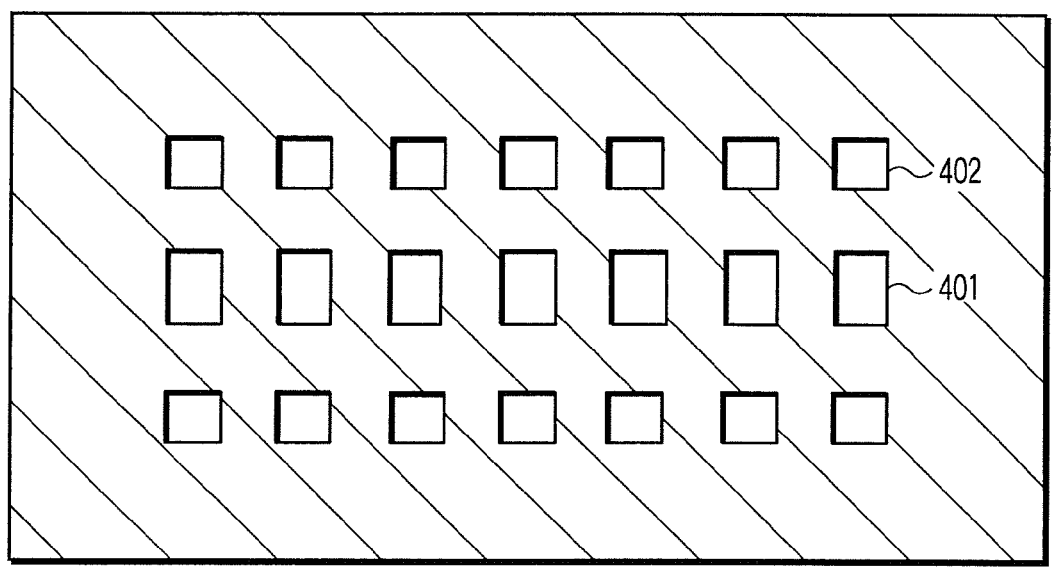
FIG. 34 is a diagram showing a pattern having assist patterns added to the pattern row shown in FIG. 33.

Description will be given of a method of manufacturing a semiconductor device using the photo mask described in the first to third and sixth embodiments. FIG. 32 is a flow chart showing the procedure of a method of manufacturing a semiconductor device according to a seventh embodiment.

Design data is provided which relates to a photo mask having an assist pattern dimensioned in association with the exposure apparatus used to transfer the pattern. A photo mask is produced on the basis of the design data (step ST101). The photo mask is stored in a exposure apparatus (step ST102).

A semiconductor substrate in which, for example, an inter-layer insulating film and the like are formed. A positive resist film is coated and formed on the semiconductor substrate (step ST103). The semiconductor substrate is stored in the exposure apparatus. To form a latent image on the resist film, the exposure apparatus is used to transfer the pattern formed on the photo mask to the resist film (step ST104). The resist film is developed (step ST105). The inter-layer insulating film is etched using the developed resist film as a mask (step ST106). Subsequently, further processing is executed to manufacture a semiconductor device.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A method of generating design data for a photo mask formed with patterns to be transferred to a substrate using an exposure apparatus, the method comprising:

providing pattern data having a pattern row in which three or more hole patterns are arranged in one direction;

executing a resizing process and a differentiating process on the hole patterns to generate an assist pattern, the longitudinal length of the assist pattern being equivalent to or larger than the length of the pattern row in one direction, the longitudinal direction of the assist pattern being substantially parallel with the one direction, the assist pattern being not transferred to the substrate; and merging the pattern data with the assist pattern to create the design data, wherein lights transmitted through the respective hole patterns are in phase, the assist pattern includes a first assist pattern for which transmitted light is in phase with the lights transmitted through the hole patterns and a second assist pattern which is located between the first assist pattern and the hole pattern and for which transmitted light is 180° out of phase with the lights transmitted through the hole patterns.

2. The method of generating data according to claim 1, wherein the exposure apparatus has an exposure wavelength $\lambda$, a projection lens of the exposure apparatus has a numerical aperture NA, and the width of the assist pattern is at most $0.3 \times \lambda/NA$.

3. The method of generating data according to claim 1, wherein a distance d between the hole pattern and the assist pattern and a side b of the hole pattern which is perpendicular to the one direction of the hole pattern has a relationship $0.3 \times b \leq d$.

4. The method of generating data according to claim 1, wherein the exposure apparatus has an exposure light wavelength $\lambda$ and a projection lens of the exposure apparatus has a numerical aperture NA, and the width W of the assist pattern in the longitudinal direction of the line patterns is $0.27 \times \lambda/NA$ in terms of dimensions on the substrate.

* * * * *